(12) United States Patent
Kobayashi et al.

(10) Patent No.: US 9,793,176 B2
(45) Date of Patent: Oct. 17, 2017

(54) SUBSTRATE PROCESSING APPARATUS AND SUBSTRATE PROCESSING METHOD

(71) Applicant: SCREEN Holdings Co., Ltd., Kyoto (JP)

(72) Inventors: Kenji Kobayashi, Kyoto (JP); Jun Sawashima, Kyoto (JP); Akihiro Nakashima, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/183,234

(22) Filed: Jun. 15, 2016

(65) Prior Publication Data

US 2016/0372341 A1    Dec. 22, 2016

(30) Foreign Application Priority Data

Jun. 18, 2015  (JP) .................................. 2015-123059

(51) Int. Cl.
*H01L 21/67* (2006.01)
*H01L 21/66* (2006.01)

(52) U.S. Cl.
CPC .......... *H01L 22/10* (2013.01); *H01L 21/6715* (2013.01); *H01L 21/67248* (2013.01)

(58) Field of Classification Search
CPC .............. H01L 22/10; H01L 21/6715; H01L 21/67248; H01L 21/67; H01L 21/6708; H01L 21/67109; H01L 21/67028; H01L 21/687; H01L 21/67017; H01L 21/68714; H01L 21/67098
See application file for complete search history.

(56) References Cited

U.S. PATENT DOCUMENTS

2004/0084315 A1* 5/2004 Mizohata ............... C25D 21/00
                                                                205/82

FOREIGN PATENT DOCUMENTS

| JP | 2000-124185 A | 4/2000 |
| JP | 2002-093773 A | 3/2002 |
| JP | 2006-344907 | 12/2006 |
| JP | 2007-149891 | 6/2007 |
| JP | 2007-258462 | 10/2007 |
| JP | 2009-054959 A | 3/2009 |
| JP | 2009-231732 A | 10/2009 |
| JP | 2011-211092 A | 10/2011 |

* cited by examiner

*Primary Examiner* — Selim Ahmed
(74) *Attorney, Agent, or Firm* — Ostrolenk Faber LLP

(57) ABSTRACT

The temperature of a chemical liquid supplied to a pot is detected while allowing a processing liquid discharge port to discharge the chemical liquid toward the pot at a pre-dispensing position. The temperature of the chemical liquid rises in response to the lapse of time. When the temperature of the chemical liquid supplied to the pot reaches a second target temperature, the processing liquid discharge port is allowed to stop the discharge of the chemical liquid. Thereafter, a positional relationship between the processing liquid discharge port and the pot is changed, and the processing liquid discharge port is allowed to discharge the chemical liquid toward the substrate at the processing position.

7 Claims, 11 Drawing Sheets

FIG. 6 DISCHARGE STATE

FIG. 11 BEFORE STARTING PRE-DISPENSING

FIG. 12 START OF PRE-DISPENSING

END OF PRE-DISPENSING

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method which process a substrate. Substrates to be processed include, for example, semiconductor wafers, liquid crystal display device substrates, plasma display substrates, FED (Field Emission Display) substrates, optical disk substrates, magnetic disk substrates, magneto-optical disk substrates, photomask substrates, ceramic substrates, and photovoltaic cell substrates.

2. Description of Related Art

Japanese Patent Application Publication No. 2006-344907 discloses a substrate processing apparatus of a single substrate processing type that processes substrates, such as semiconductor wafers, one by one. The substrate processing apparatus includes a spin chuck that rotates a substrate while horizontally holding the substrate, a chamber that contains the spin chuck, and a nozzle that discharges a high-temperature chemical liquid higher in temperature than room temperature toward the upper surface of the substrate held by the spin chuck. When a chemical liquid valve is opened, the chemical liquid is supplied from a chemical liquid supply passage to the nozzle, and is discharged from a discharge port of the nozzle.

In the substrate processing apparatus, when the chemical liquid valve is closed, the supply of the chemical liquid to a flow passage leading from the chemical liquid valve to the discharge port of the nozzle is stopped. Therefore, the temperatures of a piping etc., that define the flow passage fall. Thereafter, when the chemical liquid valve is opened to discharge the high-temperature chemical liquid, the piping etc., are warmed with the chemical liquid. The temperature of the chemical liquid discharged from the nozzle rises until the temperatures of the piping etc., are stabilized.

When a plurality of substrates are processed in the same chamber, the processing quality of a first substrate is likely to differ from that of each substrate subsequent to the first substrate. If a pre-dispensing step of causing the nozzle to discharge the chemical liquid is performed before supplying the chemical liquid to a substrate to be processed, it is possible to stabilize the temperature of the chemical liquid to be supplied to the substrate, and it is possible to improve the uniformity in processing quality.

However, in conventional substrate processing apparatuses, an actual temperature of the chemical liquid discharged from the nozzle in the pre-dispensing step is uncertain, and therefore there is a need to set the discharge time of the chemical liquid longer than a period of time required to allow the temperature of the chemical liquid to become stable. If so, an essentially needless chemical liquid will be discharged, and therefore throughput (i.e., the number of substrates to be processed per unit time) will fall, and chemical liquid consumption will increase.

This problem can be caused not only in a case in which the temperature of a processing liquid is higher than room temperature but also in a case in which the temperature of a processing liquid is lower than room temperature. Additionally, this problem can be caused not only in a case in which a substrate is processed by a high-temperature or low-temperature processing liquid but also in a case in which a substrate is processed by a high-temperature or low-temperature processing gas.

SUMMARY OF THE INVENTION

One preferred embodiment of the present invention provides a substrate processing apparatus that includes a discharge port that discharges a processing fluid that processes a substrate, a supply passage that guides a processing fluid to the discharge port, a discharge valve interposed in the supply passage, a substrate holding unit that rotates a substrate that is to be processed by a processing fluid discharged from the discharge port while horizontally holding the substrate, a pot that receives a processing fluid discharged from the discharge port, a position changing unit that changes a positional relationship between the discharge port and the pot between a processing position at which a processing fluid discharged from the discharge port is supplied to a substrate held by the substrate holding unit and a pre-dispensing position at which a processing fluid discharged from the discharge port is supplied to the pot, a downstream temperature detection unit that detects a temperature of a processing fluid supplied from the discharge port to the pot, and a controller that controls the discharge valve and the position changing unit.

The controller performs a first step of allowing the discharge port to discharge a processing fluid at the pre-dispensing position at which a processing fluid discharged from the discharge port is supplied to the pot by opening the discharge valve interposed in the supply passage that guides a processing fluid to the discharge port that discharges a processing fluid that processes a substrate, a second step of detecting a temperature of a processing fluid discharged from the discharge port by means of the downstream temperature detection unit in parallel with the first step, a third step of, based on the temperature of the processing fluid detected in the second step, stopping supplying the processing fluid from the discharge port to the pot, and a fourth step of, after finishing the third step, allowing the discharge port to discharge the processing fluid at the processing position at which the processing fluid discharged from the discharge port is supplied to the substrate held by the substrate holding unit.

The processing fluid may be a processing liquid, or may be a processing gas, or may be a mixed fluid including a liquid and a gas. Specifically, the processing fluid may be a mist of a processing liquid, and may be a vapor of a processing liquid.

According to this arrangement, the temperature of the processing fluid supplied to the pot is detected while allowing the discharge port to discharge the processing fluid toward the pot at the pre-dispensing position. Thereafter, when the temperature of the processing fluid supplied to the pot reaches a target temperature, the discharge port is allowed to stop the discharge of the processing fluid. Thereafter, a positional relationship between the discharge port and the pot is changed, and the discharge port is allowed to discharge the processing fluid toward the substrate at the processing position. Accordingly, the processing fluid is supplied to the substrate, and the substrate is processed by the processing fluid.

As described above, the discharge port is allowed to discharge a processing fluid before supplying the processing fluid to a substrate to be processed, and therefore it is possible to stabilize the temperature of the processing fluid supplied to the substrate, and it is possible to improve the uniformity in processing quality. Additionally, the discharge of the processing fluid is stopped based on an actual temperature of the processing fluid supplied to the pot, and therefore it is possible to reduce the discharge of an unnecessary processing fluid. This makes it possible to shorten a period of time required for the pre-dispensing step while reducing non-uniformity in processing quality.

In the preferred embodiment, at least one of the following features may be added to the substrate processing apparatus.

The downstream temperature detection unit includes a downstream contact surface disposed at a place against which the processing fluid discharged from the discharge port directly strikes.

According to this arrangement, a processing fluid discharged from the discharge port directly strikes against the downstream contact surface of the downstream temperature detection unit. Therefore, it is possible to remove a change in temperature of the processing fluid caused by the other members, and it is possible to accurately detect the temperature of the processing fluid supplied to the pot.

The downstream temperature detection unit includes a downstream contact surface that inclines obliquely with respect to a horizontal plane, and detects a temperature of the processing fluid contiguous to the downstream contact surface.

According to this arrangement, the downstream contact surface of the downstream temperature detection unit inclines obliquely, and therefore a processing fluid (particularly, a processing liquid) supplied to the downstream contact surface flows obliquely downwardly along the downstream contact surface. Therefore, it is possible to restrain or prevent the processing fluid from staying at the downstream contact surface. Additionally, the processing fluid flows along the downstream contact surface, and therefore it is possible to widen an area in which the processing fluid comes into contact with the downstream contact surface. This makes it possible to accurately detect the temperature of the processing fluid.

The pot includes an exhaust port that discharges the processing fluid from an inside of the pot, and the downstream contact surface inclines obliquely downwardly toward the exhaust port.

According to this arrangement, the processing fluid supplied from the discharge port to the pot is discharged from the pot by the exhaust port. The processing fluid supplied to the downstream contact surface is guided toward the exhaust port by the downstream contact surface that inclines obliquely downwardly. This makes it possible to facilitate the discharge of the processing fluid from the inside of the pot, and makes it possible to restrain or prevent the processing fluid from staying on the downstream contact surface.

The downstream temperature detection unit includes a downstream contact surface made of a material including silicon carbide, and detects a temperature of the processing fluid contiguous to the downstream contact surface.

Silicon carbide has not only chemical resistance but also high thermal conductivity. Therefore, it is possible to shorten a period of time required to detect the temperature of the processing fluid by making the downstream contact surface of the downstream temperature detection unit of a material including silicon carbide. Additionally, although silicon carbide has the possibility of generating contaminants that contaminate a substrate in a processing fluid, the processing fluid supplied to the pot is discharged from the pot without being supplied to the substrate. Therefore, it is possible to detect the temperature of the processing fluid in a short time while preventing the substrate from being contaminated by contaminants precipitated from silicon carbide.

The substrate processing apparatus further includes an upstream temperature detection unit that detects a temperature of the processing fluid that is present in the supply passage on an upstream side of the discharge valve, and the upstream temperature detection unit includes an upstream contact surface contiguous to the processing fluid that is present in the supply passage and detects a temperature of the processing fluid contiguous to the upstream contact surface, and the downstream temperature detection unit includes a downstream contact surface made of a material having higher thermal conductivity than the upstream contact surface of the upstream temperature detection unit and detects a temperature of the processing fluid contiguous to the downstream contact surface.

According to this arrangement, the upstream temperature detection unit is disposed upstream of the discharge valve, and therefore the upstream contact surface of the upstream temperature detection unit is in contact with the processing fluid that is present in the supply passage even when the discharge valve is in a closed state. Therefore, even if a period of temperature detection time by means of the upstream temperature detection unit is comparatively long, any problems will never arise with respect to throughput or with respect to processing fluid consumption.

On the other hand, if a period of temperature detection time by means of the downstream temperature detection unit is long, the processing fluid continues to be discharged in spite of the fact that the temperature of the processing fluid discharged from the discharge port is stable. The downstream contact surface of the downstream temperature detection unit is made of a material higher in thermal conductivity than the upstream contact surface of the upstream temperature detection unit. Therefore, it is possible to shorten the period of temperature detection time by means of the downstream temperature detection unit, and it is possible to reduce the discharge of an unnecessary processing fluid.

A distance to the downstream temperature detection unit from the discharge port at the pre-dispensing position is equal to a distance to the substrate from the discharge port at the processing position. The term "equal" includes not only a case in which the two distances strictly coincide with each other but also a case in which the two distances slightly differ from each other (for example, a case in which a difference between the two distances is about 1 to 5 millimeters).

The temperature of the processing fluid discharged toward the substrate slightly changes in a space between the discharge port and the substrate. According to this arrangement, it is possible to artificially detect the temperature of the processing fluid actually supplied to the substrate because the distance to the downstream temperature detection unit from the discharge port at the pre-dispensing position is equal to the distance to the substrate from the discharge port at the processing position. This makes it possible to more precisely monitor the processing conditions of the substrate.

Another preferred embodiment of the present invention provides a substrate processing method that includes a first step of allowing a discharge port to discharge a processing fluid at a pre-dispensing position at which a processing fluid discharged from the discharge port is received by a pot by opening a discharge valve interposed in a supply passage that guides the processing fluid to the discharge port that discharges the processing fluid that processes a substrate, a second step of detecting a temperature of the processing fluid discharged from the discharge port by means of a downstream temperature detection unit in parallel with the first step, a third step of, based on the temperature of the processing fluid detected in the second step, stopping supplying the processing fluid from the discharge port to the pot, and a fourth step of, after finishing the third step, allowing the discharge port to discharge the processing fluid at a processing position at which the processing fluid discharged from the discharge port is supplied to the substrate held by the substrate holding unit that rotates the substrate while horizontally holding the substrate. According to this arrangement, it is possible to fulfill the aforementioned effects.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

Figure 1:
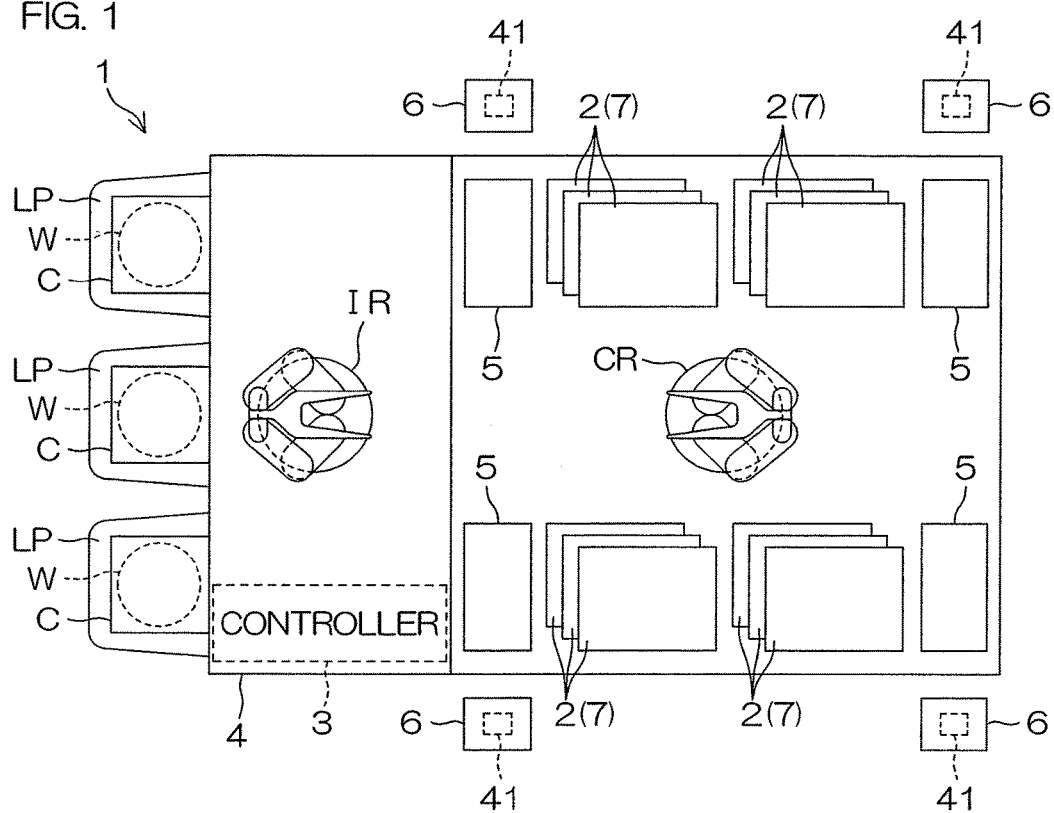
FIG. 1 is a schematic view of a substrate processing apparatus according to a preferred embodiment of the present invention when viewed from above.

FIG. 1 is a schematic view of a substrate processing apparatus 1 according to a preferred embodiment of the present invention when viewed from above.

The substrate processing apparatus 1 is a single substrate processing type apparatus that processes disk-shaped substrates W, such as semiconductor wafers, one by one. The substrate processing apparatus 1 includes a plurality of load ports LP that holds a plurality of carriers C each of which contains a substrate W, a plurality of (e.g., twelve) processing units 2 that process substrates W conveyed from the plurality of load ports LP by use of a processing liquid such as a chemical liquid, and a transfer robot that conveys substrates W between the load ports LP and the processing units 2.

When the carrier C is conveyed to the load port LP, a recipe that prescribes processing conditions of the substrate W in the carrier C is transmitted to the substrate processing apparatus 1 from a host computer. Thereafter, an indexer robot IR of the transfer robot carries out the substrate W from the carrier C. The substrate W carried out therefrom is carried into any one of the processing units 2 by a center robot CR of the transfer robot. The substrate W processed by the processing unit 2 is conveyed to the carrier C on the load port LP by the indexer robot IR and the center robot CR.

The substrate processing apparatus 1 includes a plurality of fluid boxes 5, each housing fluid devices including a discharge valve 51 that controls supplying of the processing liquid to the processing unit 2 and its stoppage, and a plurality of storage boxes 6, each housing a tank 41 storing the chemical liquid to be supplied to the processing unit 2 via the fluid boxes 5. The processing unit 2 and the fluid boxes 5 are disposed inside a frame 4 of the substrate processing apparatus 1. A chamber 7 of the processing unit 2 and the fluid boxes 5 are aligned in a horizontal direction. The storage boxes 6 are disposed outside the frame 4. The storage boxes 6 may be disposed inside the frame 4.

Figure 2:
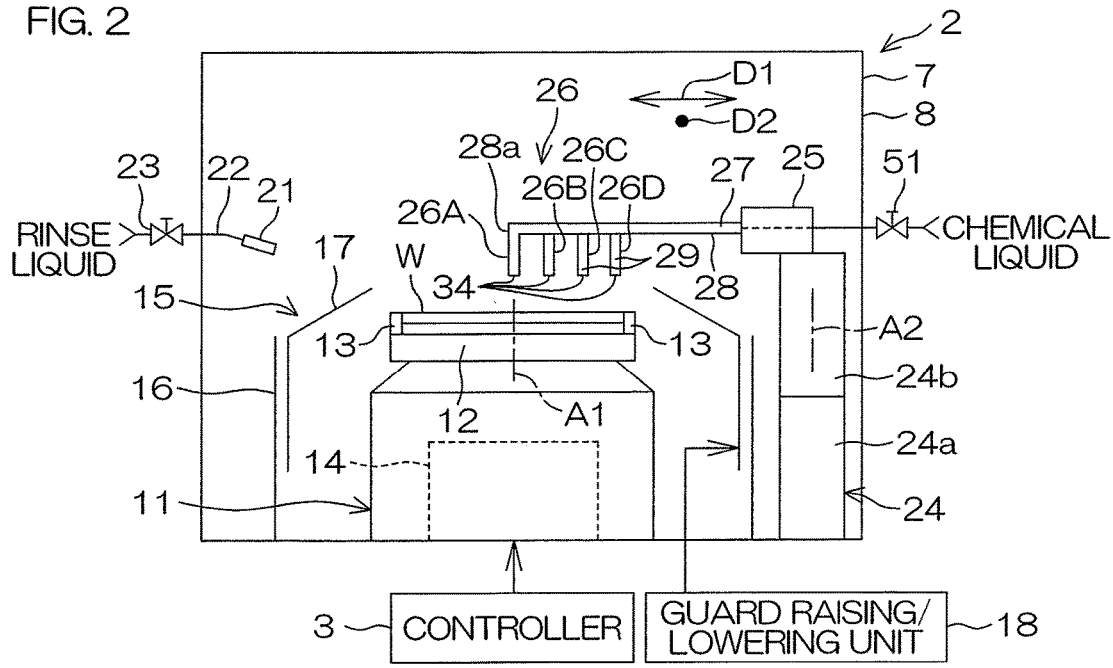
FIG. 2 is a schematic front view showing the inside of a processing unit included in the substrate processing apparatus.
Figure 3:
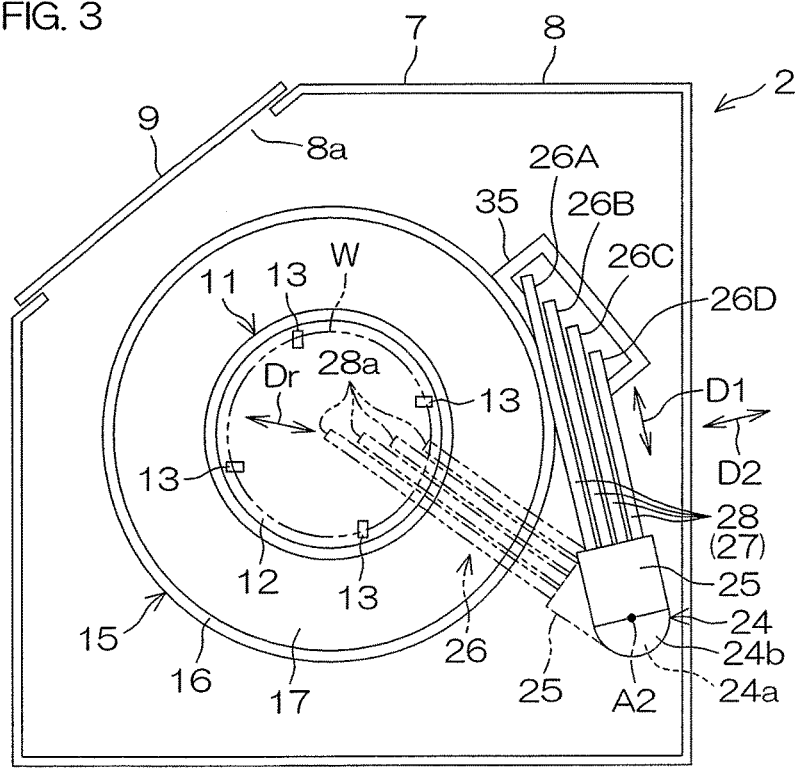
FIG. 3 is a schematic plan view showing the inside of the processing unit.

FIG. 2 is a schematic front view showing the inside of the processing unit 2. FIG. 3 is a schematic plan view showing the inside of the processing unit 2.

As shown in FIG. 2, the processing unit 2 includes a box-shaped chamber 7, a spin chuck 11 rotating the substrate W around a vertical rotational axis A1 passing through a central portion of the substrate W while holding the substrate W horizontally inside the chamber 7, and a cylindrical cup 15 receiving the processing liquid expelled from the substrate W. The spin chuck 11 is an example of a substrate holding unit.

As shown in FIG. 3, the chamber 7 includes a box-shaped partition wall 8, provided with a carry-in/carry-out port 8a through which the substrate W passes, and a shutter 9 that opens and closes the carry-in/carry-out port 8a. The shutter 9 is movable with respect to the partition wall 8 between an open position at which the carry-in/carry-out port 8a is open and a closed position (position shown in FIG. 3) at which the carry-in/carry-out port 8a is closed. The center robot CR (refer to FIG. 1) carries the substrate W into the chamber 7 through the carry-in/carry-out port 8a and carries out the substrate W from the chamber 7 through the carry-in/carry-out port 8a.

As shown in FIG. 2, the spin chuck 11 includes a disk-shaped spin base 12 that is held in a horizontal orientation, a plurality of chuck pins 13 that hold the substrate W in a horizontal orientation above the spin base 12, and a spin motor 14 that rotates the plurality of chuck pins 13 to rotate the substrate W around a rotational axis A1. The spin chuck 11 is not restricted to a clamping type chuck in which the plurality of chuck pins 13 are brought into contact with a peripheral end surface of the substrate W, and may be a vacuum type chuck in which a rear surface (lower surface) of the substrate W that is a non-device forming surface is suctioned onto an upper surface of the spin base 12 to hold the substrate W horizontally.

As shown in FIG. 3, the cup 15 includes a cylindrical splash guard 17 that surrounds the spin chuck 11 around the rotational axis A1 and a circular cylindrical outer wall 16 surrounding the splash guard 17 around the rotational axis A1. The processing unit 2 includes a guard raising/lowering unit 18 that raises and lowers the splashguard 17 vertically between an upper position (position shown in FIG. 2) at which an upper end of the splash guard 17 is positioned higher than a position at which the spin chuck 11 holds the substrate W and a lower position at which the upper end of the splash guard 17 is positioned lower than the position at which the spin chuck 11 holds the substrate W.

The processing unit 2 further includes a rinse liquid nozzle 21 that discharges a rinse liquid downward toward an upper surface of the substrate W held by the spin chuck 11. The rinse liquid nozzle 21 is connected to a rinse liquid piping 22 in which a rinse liquid valve 23 is interposed. The processing unit 2 may include a nozzle moving unit that moves the rinse liquid nozzle 21 between a processing position and a standby position.

When the rinse liquid valve 23 is opened, the rinse liquid is supplied from the rinse liquid piping 22 to the rinse liquid nozzle 21 and discharged from the rinse liquid nozzle 21. The rinse liquid is, for example, pure water (deionized water). The rinse liquid is not restricted to pure water and may instead be any of carbonated water, electrolyzed ion water, hydrogen water, ozone water, or aqueous hydrochloric acid solution of dilute concentration (of, for example, approximately 10 to 100 ppm), etc.

The processing unit 2 includes a plurality of processing liquid nozzles 26 (first processing liquid nozzle 26A, second processing liquid nozzle 26B, third processing liquid nozzle 26C, and fourth processing liquid nozzle 26D) that discharge chemical liquid which is an example of the processing liquid downward, a holder 25 that holds each of the plurality of processing liquid nozzles 26, and a nozzle moving unit 24 that moves the holder 25 to move the plurality of processing liquid nozzles 26. The nozzle moving unit 24 is an example of a position changing unit.

As shown in FIG. 2, the plurality of the processing liquid nozzles 26 are connected to a chemical liquid piping in which the discharge valve 51 is interposed. When the discharge valve 51 is opened, the chemical liquid is supplied to the plurality of the processing liquid nozzles 26 and discharged from the plurality of the processing liquid nozzles 26. Representative examples of the chemical liquid include etching liquids, such as TMAH (tetramethylammonium hydroxide aqueous solution), etc., and resist removing liquids, such as SPM (sulfuric acid/hydrogen peroxide mixture), etc. The chemical liquid is not restricted to TMAH and SPM, and may be a liquid containing at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali besides TMAH, a surfactant, and a corrosion inhibitor.

Each of the processing liquid nozzles 26 includes a nozzle arm 27 that is cantilevered by the holder 25. The nozzle arm 27 includes a horizontal portion 28 extending in a horizontal longitudinal direction D1 from the holder 25 and a vertical portion 29 extending downward from a tip 28a of the horizontal portion 28. A plurality of horizontal portions 28 are parallel to each other and a plurality of vertical portions 29 are parallel to each other. The tip 28a of the horizontal portion 28 means a portion disposed furthest in the longitudinal direction D1 from the holder 25 in a plan view.

As shown in FIG. 3, the plurality of horizontal portions 28 are aligned in a horizontal alignment direction D2, orthogonal to the longitudinal direction D1, in the order of the first processing liquid nozzle 26A to the fourth processing liquid nozzle 26D. The plurality of horizontal portions 28 are disposed at the same height. An interval between two horizontal portions 28 that are adjacent in the alignment direction D2 may be the same as any of the other intervals or may differ from at least one of the other intervals. FIG. 3 shows an example where the plurality of horizontal portions 28 are disposed at equal intervals.

Lengths of the plurality of horizontal portions 28 in the longitudinal direction D1 decrease in the order of the first processing liquid nozzle 26A to the fourth processing liquid nozzle 26D. Tips of the plurality of processing liquid nozzles 26 (the tips 28a of the plurality of horizontal portions 28) are shifted in the longitudinal direction D1 so as to be aligned in the order of the first processing liquid nozzle 26A to the fourth processing liquid nozzle 26D in regard to the longitudinal direction D1. The tips of the plurality of processing liquid nozzles 26 are aligned rectilinearly in a plan view.

The nozzle moving unit 24 includes a horizontal driving unit 24a that horizontally moves the plurality of processing liquid nozzles 26 by horizontally moving the holder 25 between a processing position (position shown by the alternate long and two short dashes line in FIG. 3) and a pre-dispensing position (position shown by the solid line in FIG. 3) and a vertical driving unit 24b that vertically moves the plurality of processing liquid nozzles 26 by vertically moving the holder 25. The processing unit 2 includes a bottomed cylindrical pot 35 disposed below the plurality of processing liquid nozzles 26 positioned at the pre-dispensing position. The pot 35 is disposed around the cup 15 when viewed planarly.

As shown in FIG. 2, the horizontal driving unit 24a is a turn unit that horizontally moves the plurality of processing liquid nozzles 26 around a nozzle turn axis A2 that vertically extends around the cup 15. The horizontal driving unit 24a supports the holder 25 through the vertical driving unit 24b. The horizontal driving unit 24a horizontally moves the holder 25 by turning the vertical driving unit 24b around the nozzle turn axis A2. Accordingly, the plurality of processing liquid nozzles 26 horizontally move between the processing position and the pre-dispensing position.

The processing position is a position at which the chemical liquids discharged from the plurality of processing liquid nozzles 26 land on the upper surface of the substrate W. At the processing position, the plurality of processing liquid nozzles 26 and the substrate W overlap in a plan view and the tips of the plurality of processing liquid nozzles 26 are aligned in a radial direction Dr in the order of the first processing liquid nozzle 26A to the fourth processing liquid nozzle 26D from the rotational axis A1 side. In this state, the tip of the first processing liquid nozzle 26A overlaps with a central portion of the substrate W in a plan view and the tip of the fourth processing liquid nozzle 26D overlaps with a peripheral edge portion of the substrate W in a plan view.

The pre-dispensing position is a standby position in which the plurality of processing liquid nozzles 26 and the substrate W do not overlap in a plan view. At the pre-dispensing position, the tips of the plurality of processing liquid nozzles 26, in a plan view, are positioned outside the cup 15 and along an outer circumferential surface of the cup 15 (outer circumferential surface of the outer wall 16) and are aligned in a circumferential direction (direction around the rotational axis A1) in the order of the first processing liquid nozzle 26A to the fourth processing liquid nozzle 26D. The plurality of processing liquid nozzles 26 are disposed so as to move away from the rotational axis A1 in the order of the first processing liquid nozzle 26A to the fourth processing liquid nozzle 26D. At the pre-dispensing position, the tips of the plurality of processing liquid nozzles 26 overlap with the pot 35, in a plan view.

The substrate processing apparatus 1 includes a controller 3 that controls the substrate processing apparatus 1. The controller 3 is a computer that includes a processor and a memory. The controller 3 allows the processing liquid nozzle 26 to discharge a chemical liquid at the pre-dispensing position before supplying a chemical liquid discharged from the processing liquid nozzle 26 to the substrate W. Accordingly, a processing liquid that remains in the processing liquid nozzle 26 etc., is discharged into the pot 35 (pre-dispensing step).

When the substrate W is processed by the processing unit 2, the controller 3 allows the spin chuck 11 to rotate the substrate W while holding the substrate W. In this state, the controller 3 allows the plurality of processing liquid nozzles 26 positioned at the processing position to discharge a chemical liquid toward the upper surface of the rotating substrate W by opening the discharge valve 51. Accordingly, the chemical liquid is supplied to the whole area of the upper surface of the substrate W (chemical liquid supply step). Additionally, the chemical liquid that has been scattered around the substrate W is caught by the inner peripheral surface of the splash guard 17 positioned at the upper position.

The controller 3 allows the plurality of processing liquid nozzles 26 to stop the discharge of the chemical liquid, and then allows the rinse liquid nozzle 21 to discharge pure water that is an example of the rinse liquid toward the rotating substrate W by opening the rinse liquid valve 23. Accordingly, the pure water is supplied to the whole area of the upper surface of the substrate W, and the chemical liquid adhering to the substrate W is rinsed away (rinse liquid supply step). Additionally, the pure water that has been scattered around the substrate W is caught by the inner peripheral surface of the splash guard 17 positioned at the upper position.

The controller 3 allows the rinse liquid nozzle 21 to stop the discharge of the pure water, and then allows the spin chuck 11 to rotate the substrate W at a high speed. Accordingly, the pure water adhering to the substrate W is shaken off to the surroundings of the substrate W by a centrifugal force. Therefore, the pure water is removed from the substrate W, and the substrate W is dried (drying step). Thereafter, the controller 3 stops the rotation of the substrate W, and then allows the center robot CR (see FIG. 1) to carry the substrate W out of the chamber 7.

Processing Liquid Nozzle 26

Next, the processing liquid nozzle 26 positioned at the processing position will be described in detail.

Figure 4:
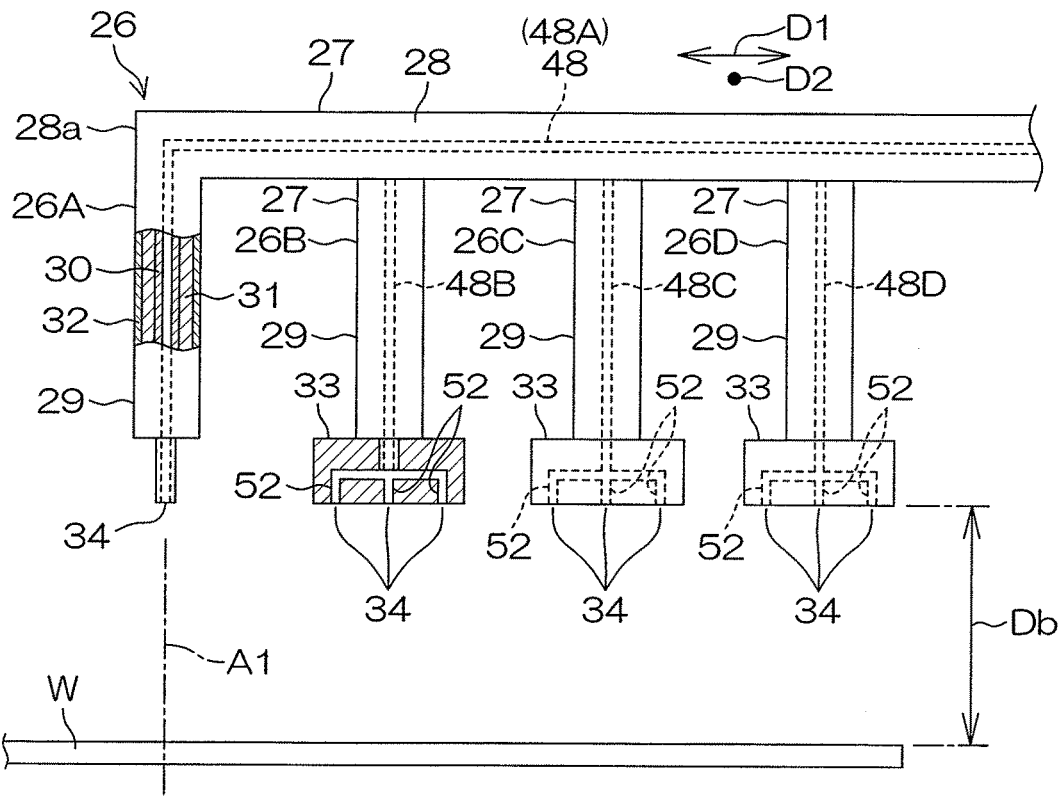
FIG. 4 is a schematic view of a plurality of processing liquid nozzles positioned at a processing position when viewed horizontally.
Figure 5:
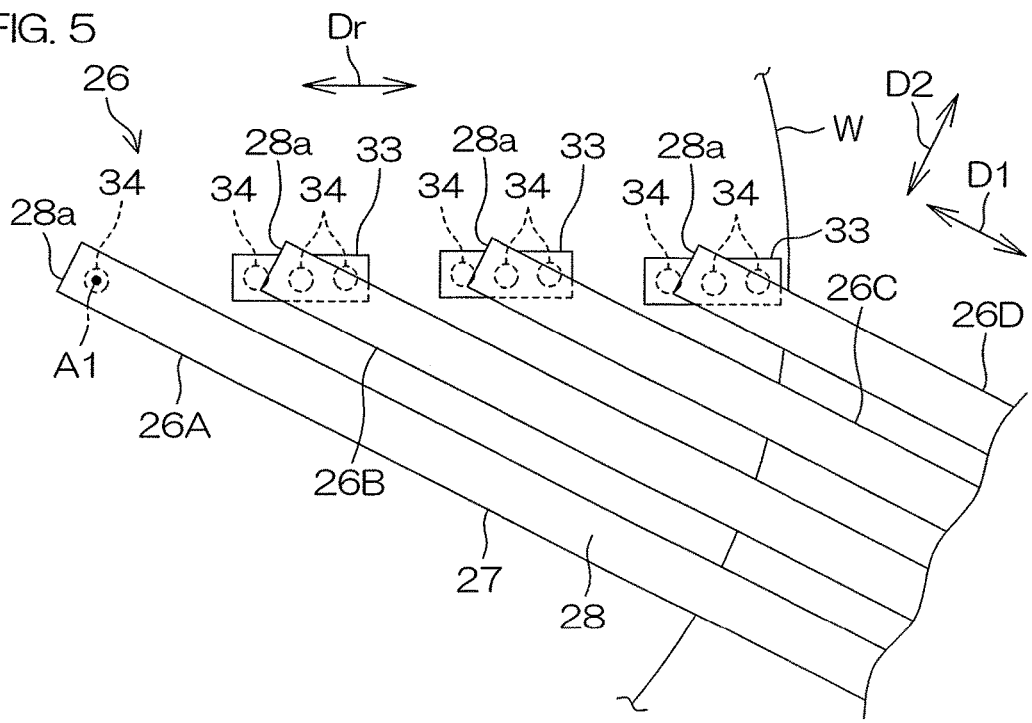
FIG. 5 is a schematic view of the plurality of processing liquid nozzles positioned at the processing position when viewed from above.

FIG. 4 is a schematic view obtained by horizontally viewing the plurality of processing liquid nozzles 26 positioned at the processing position. FIG. 5 is a schematic view obtained by, from above, viewing the plurality of processing liquid nozzles 26 positioned at the processing position.

In the following description, "first" and "A" may be added to the head and the end of an arrangement corresponding to the first processing liquid nozzle 26A. For example, an upstream flow passage 48 corresponding to the first processing liquid nozzle 26A may be referred to as the "first upstream flow passage 48A." The same applies to arrangements corresponding to the second processing liquid nozzle 26B to the fourth processing liquid nozzle 26D. Specifically, an upstream flow passage 48 corresponding to the second processing liquid nozzle 26B may be referred to as the "second upstream flow passage 48B."

As shown in FIG. 4, each nozzle arm 27 includes a resin tube 30 that guides the processing liquid, a core bar 31 including cylindrical cross section that surrounds the resin tube 30, and a resin coating 32 including cylindrical cross section that surrounds an outer surface of the core bar 31. Each of the processing liquid nozzles 26 besides the first processing liquid nozzle 26A further includes a nozzle head 33 mounted on the vertical portion 29 of the nozzle arm 27.

The nozzle arm 27 defines one flow passage 48 that extends along the nozzle arm 27. The flow passage 48 of the first processing liquid nozzle 26A defines a processing liquid discharge port 34 that opens in the lower surface of the nozzle arm 27. The nozzle head 33 defines a plurality of flow passages 52 that guide a processing liquid supplied from the nozzle arm 27. The plurality of flow passages 52 of the nozzle head 33 define a plurality of processing liquid discharge ports 34 that open in the lower surface of the nozzle head 33.

FIG. 4 and FIG. 5 show an example where the total number of processing liquid discharge ports 34 disposed in the plurality of processing liquid nozzles 26 is ten. The first processing liquid nozzle 26A includes a single processing liquid discharge port 34 disposed in the nozzle arm 27. Each of the processing liquid nozzles 26 besides the first processing liquid nozzle 26A includes three processing liquid discharge ports 34 disposed in the nozzle head 33. The three processing liquid discharge ports 34 disposed in the same nozzle head 33 are constituted of an inner discharge port that is closest to the rotational axis A1 among the three processing liquid discharge ports 34, an outer discharge port that is furthest from the rotational axis A1 among the three processing liquid discharge ports 34, and a middle discharge port disposed between the inner discharge port and the outer discharge port.

As shown in FIG. 5, the plurality of processing liquid discharge ports 34 are aligned rectilinearly in a plan view. An interval between the two processing liquid discharge ports 34 at the respective ends is not more than a radius of the substrate W. An interval between two processing liquid discharge ports 34 that are adjacent may be the same as any of the other intervals or may differ from at least one of the other intervals. Also, the plurality of processing liquid discharge ports 34 may be disposed at the same height or maybe disposed at two or more different heights.

When the plurality of processing liquid nozzles 26 are disposed at the processing position, the plurality of processing liquid discharge ports 34 are respectively disposed at a plurality of positions that differ in distance (shortest distance in a plan view) from the rotational axis A1. In this state, an innermost discharge port (the processing liquid discharge port 34 of the first processing liquid nozzle 26A) that is closest to the rotational axis A1 among the plurality of processing liquid discharge ports 34 is disposed above a central portion of the substrate W, and an outermost discharge port (the processing liquid discharge port 34 of the fourth processing liquid nozzle 26D) that is furthest from the rotational axis A1 among the plurality of processing liquid discharge ports 34 is disposed above a peripheral edge portion of the substrate W, The plurality of processing liquid discharge ports 34 are aligned in the radial direction Dr in a plan view. Each of the processing liquid discharge ports 34 discharges the chemical liquid in a discharge direction perpendicular to the upper surface of the substrate W.

Processing Liquid Supply System

Next, the processing liquid supply system of the substrate processing apparatus 1 will be described.

Figure 6:
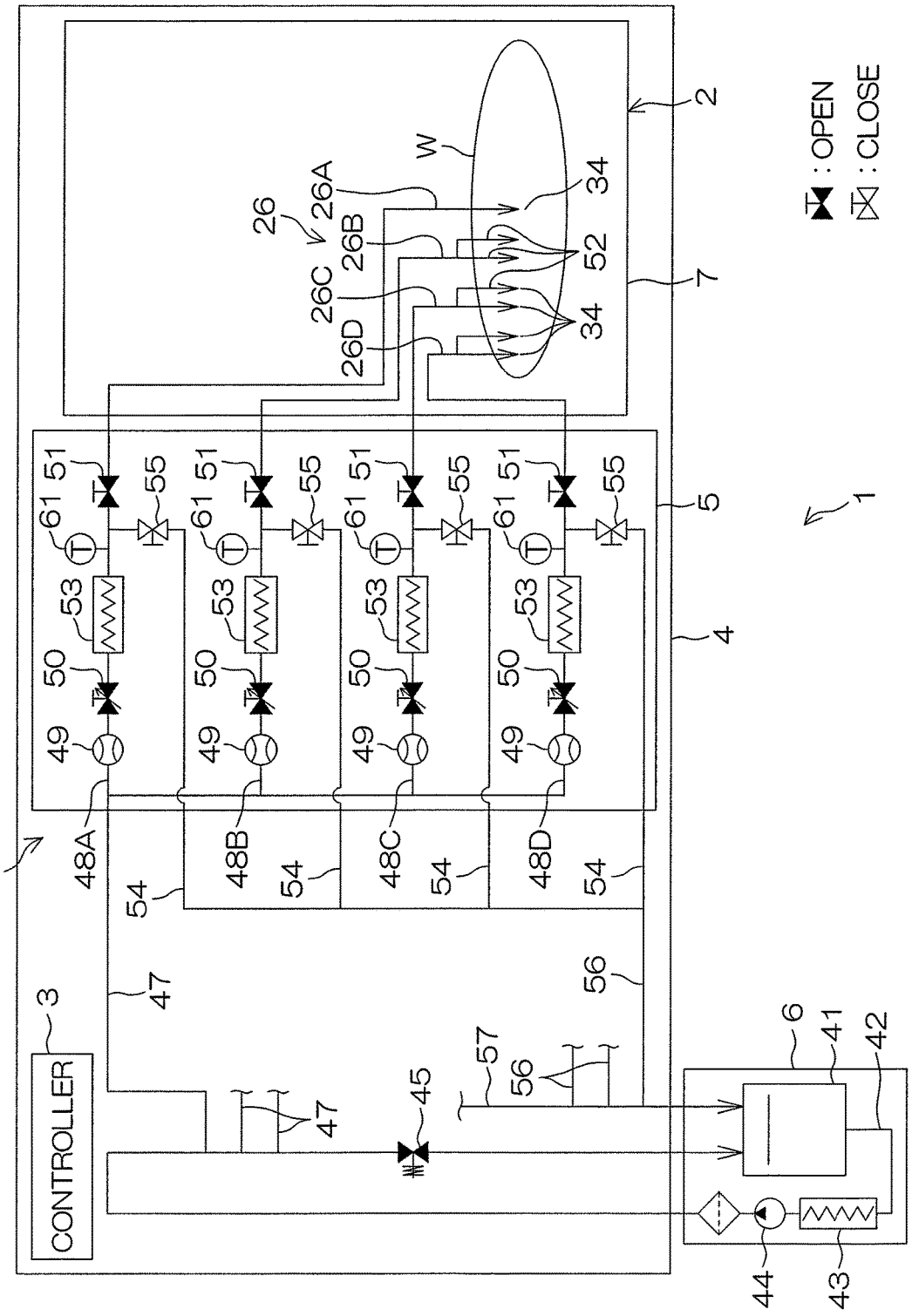
FIG. 6 is a schematic view showing a processing liquid supply system in a discharge state.
Figure 7:
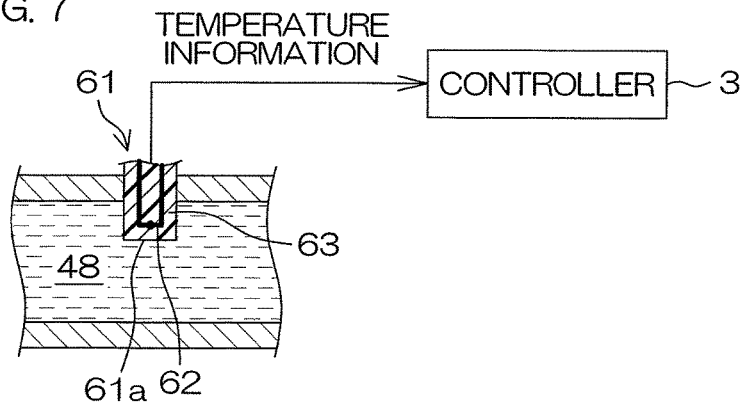
FIG. 7 is a schematic cross-sectional view showing an upstream thermometer.

FIG. 6 is a schematic view showing the processing liquid supply system that is in a discharge state. FIG. 7 is a schematic cross-sectional view showing an upstream thermometer 61. In FIG. 6, an open valve is depicted in black, and a closed valve is depicted in white.

As shown in FIG. 6, the processing liquid supply system includes the tank 41 in which a chemical liquid is stored, a circulation flow passage 42 forming a circuit in which the chemical liquid in the tank 41 is circulated, an upstream heater 43 that adjusts the temperature of the chemical liquid in the tank 41 by heating the chemical liquid flowing through the circulation flow passage 42 at a temperature higher than room temperature (e.g., 20 to 30° C.), a pump 44 that always transfers the chemical liquid in the tank 41 to the circulation flow passage 42, and a pressure control valve 45 that changes the flow passage area of the circulation flow passage 42 in the lower course of the pump 44. The pressure control valve 45 is a backpressure valve that keeps the pressure on the primary side (upstream side) at a set pressure.

The processing liquid supply system additionally includes a plurality of supply flow passages 47 connected to the circulation flow passage 42. The supply flow passages 47 correspond to the processing units 2, respectively. The plurality of processing liquid nozzles 26 disposed at the same processing unit 2 discharge a chemical liquid supplied through the same supply flow passage 47.

The processing liquid supplying system includes the plurality of upstream flow passages 48 (first upstream flow passage 48A to fourth upstream flow passage 48D) branching from the supply flow passage 47, a plurality of flowmeters 49 detecting flow rates of the liquids flowing inside the plurality of upstream flow passages 48, a plurality of flow control valves 50 that change the flow rates of the liquids flowing inside the plurality of upstream flow passages 48, and a plurality of discharge valves 51 respectively opening and closing the plurality of upstream flow passages 48. Although unillustrated, each flow control valve 50 includes a main valve body that opens and closes the flow passage and an actuator that changes an open degree of the main valve body. The actuator may be a pneumatic actuator or an electric actuator or an actuator besides these.

The upstream flow passages 48 correspond to the processing liquid nozzles 26, respectively. Three upstream flow passages 48 corresponding to the second processing liquid nozzle 26B, the third processing liquid nozzle 26C, and the fourth processing liquid nozzle 26D, respectively, branch into the plurality of downstream flow passages 52, respectively. In other words, the second upstream flow passage 48B, the third upstream flow passage 48C, and the fourth upstream flow passage 48D are branch-upstream flow passages that branch into the plurality of downstream flow passages 52, respectively. FIG. 6 shows an example in which the branch upstream flow passage branches into two downstream flow passages 52. FIG. 4 shows an example in which the branch upstream flow passage branches into three downstream flow passages 52.

As shown in FIG. 4, the three downstream flow passages 52 branching from the second upstream flow passage 48B are respectively connected to the three processing liquid discharge ports 34 (the inner discharge port, middle discharge port, and the outer discharge port) disposed in the same nozzle head 33. The same as the second upstream flow passage 48B applies to the third upstream flow passage 48C and the fourth upstream flow passage 48D. The first upstream flow passage 48A is connected to the first processing liquid discharge port 34 disposed in the first processing liquid nozzle 26A.

The processing liquid supply system includes a plurality of downstream heaters 53 that heat a liquid flowing through the plurality of upstream flow passages 48. The downstream heaters 53 are interposed in the upstream flow passages 48, respectively. The heat temperature (downstream temperature) of the processing liquid heated by the downstream heater 53 is higher than the heat temperature (upstream temperature) of the processing liquid heated by the upstream heater 43. The heat temperature of the processing liquid heated by the plurality of downstream heaters 53 becomes higher in order from the first upstream flow passage 48A to the fourth upstream flow passage 48D. Therefore, the temperature of a chemical liquid discharged from each of the plurality of processing liquid discharge ports 34 stepwisely becomes higher in proportion to a retreat from the rotational axis A1.

The processing liquid supply system includes a plurality of individual return flow passages 54 connected to the plurality of upstream flow passages 48, respectively, at downstream positions with respect to the plurality of downstream heaters 53, a plurality of return valves 55 that open and close the plurality of individual return flow passages 54, respectively, and a collective return flow passage 56 connected to each individual return flow passage 54. An upstream end of the individual return flow passage 54 is connected to the upstream flow passage 48 between the downstream heater 53 and the discharge valve 51. The plurality of return valves 55 are interposed in the plurality of individual return flow passages 54, respectively.

The processing liquid supply system includes a tank recovery flow passage 57 that guides a chemical liquid in the collective return flow passage 56 to the tank 41. The processing liquid supply system may additionally include a cooler that cools a chemical liquid supplied from the collective return flow passage 56 to the tank recovery flow passage 57. The collective return flow passage 56 is connected to the tank recovery flow passage 57. The collective return flow passage 56 corresponding to the other processing units 2 is also connected to the tank recovery flow passage 57. When the return valve 55 is opened, the chemical liquid in the upstream flow passage 48 flows from the upstream flow passage 48 to the individual return flow passage 54, and flows from the individual return flow passage 54 to the collective return flow passage 56. The chemical liquid in the collective return flow passage 56 returns to the tank 41 through the tank recovery flow passage 57.

The processing liquid supply system includes a plurality of upstream thermometers 61 that detect the temperature of a liquid heated by the plurality of downstream heaters 53 at the plurality of upstream flow passages 48. The upstream thermometers 61 are interposed in the upstream flow passages 48, respectively. The upstream thermometer 61 is disposed between the downstream heater 53 and the discharge valve 51. The upstream thermometer 61 is an example of an upstream temperature detection unit.

The upstream thermometer 61 is a thermocouple thermometer. As shown in FIG. 7, the upstream thermometer 61 includes a thermocouple wire 62 formed of two kinds of metal wires and a synthetic resin portion 63 with which the thermocouple wire 62 is covered. The synthetic resin portion 63 is made of a synthetic resin material that has chemical resistance. The synthetic resin material is fluorine resin such as PFA (perfluoroalkoxy alkanes) or PTFE (polytetrafluoroethylene). The upstream thermometer 61 includes an upstream contact surface 61a contiguous to a chemical liquid flowing through the upstream flow passage 48. The upstream thermometer 61 is connected to the controller 3. Based on a detection value of the upstream thermometer 61, the controller 3 detects the temperature of the chemical liquid flowing through the upstream flow passage 48.

Processing Liquid Supply System in a Discharge State

Next, the processing liquid supply system being in a discharge state in which the plurality of processing liquid discharge ports 34 discharge a chemical liquid will be described with reference to FIG. 6.

A chemical liquid in the tank 41 is sent to the circulation flow passage 42 by means of the pump 44. Part of the chemical liquid is heated by the upstream heater 43, and then flows from the circulation flow passage 42 to the supply flow passage 47, and flows from the supply flow passage 47 to the plurality of upstream flow passages 48. The remaining chemical liquid that has passed through a connection portion between the circulation flow passage 42 and the supply flow passage 47 flows toward the tank 41 through the circulation flow passage 42.

The chemical liquid in the first upstream flow passage 48A is heated by the downstream heater 53 corresponding to the first upstream flow passage 48A, and is then supplied to one processing liquid discharge port 34 disposed at the first processing liquid nozzle 26A. The chemical liquid in the second upstream flow passage 48B is heated by the downstream heater 53 corresponding to the second upstream flow passage 48B, and is then supplied through the plurality of downstream flow passages 52 to the plurality of processing liquid discharge ports 34B disposed at the second processing liquid nozzle 26B. The third upstream flow passage 48C and the fourth upstream flow passage 48D function in the same way as the second upstream flow passage 48B. As a result, the chemical liquid is discharged from all processing liquid discharge ports 34.

Processing Liquid Supply System in a Discharge-Stopped State

Next, the processing liquid supply system being in a discharge-stopped state in which the discharge of a chemical liquid from the plurality of processing liquid discharge ports 34 has been stopped will be described with reference to FIG. 6. In the discharge-stopped state, the discharge valve 51 is closed, and the return valve 55 is opened although FIG. 6 shows a state in which the discharge valve 51 is in an open state and in which the return valve 55 is in a closed state.

A chemical liquid in the tank 41 is sent to the circulation flow passage 42 by means of the pump 44. Part of the chemical liquid is heated by the upstream heater 43, and then flows from the circulation flow passage 42 to the supply flow passage 47, and flows from the supply flow passage 47 to the plurality of upstream flow passages 48. The remaining chemical liquid that has passed through the connection portion between the circulation flow passage 42 and the supply flow passage 47 flows toward the tank 41 through the circulation flow passage 42.

The chemical liquid in the first upstream flow passage 48A is heated by the downstream heater 53 corresponding to the first upstream flow passage 48A, and then returns to the tank 41 through the individual return flow passage 54, the collective return flow passage 56, and the tank recovery flow passage 57. Likewise, the chemical liquids in the second upstream flow passage 48B, in the third upstream flow passage 48C, and in the fourth upstream flow passage 48D are heated by the downstream heater 53, and then return to the tank 41 through the individual return flow passage 54 etc. As a result, all chemical liquids sent to the supply flow passage 47 return to the tank 41.

The temperature of the processing liquid may have a large influence on the processing of the substrate W. If the downstream heaters 53 are stopped during discharge stoppage, it will take time for the temperatures of the processing liquids, heated by the downstream heaters 53, to stabilize at the intended temperatures when operation of the downstream heaters 53 is restarted. The discharge of processing liquid thus cannot be restarted immediately and throughput decreases. As described above, even during discharge stoppage, the downstream heaters 53 heat the chemical liquids. A state where the temperatures of the downstream heaters 53 are stable can thus be maintained. Further, the chemical liquids heated by the downstream heaters 53 are returned to the tank 41 and the consumption amount of the chemical liquid can thus be reduced.

Pot 35

Next, the pot 35 and a downstream thermometer 71 will be described in detail.

Figure 8:
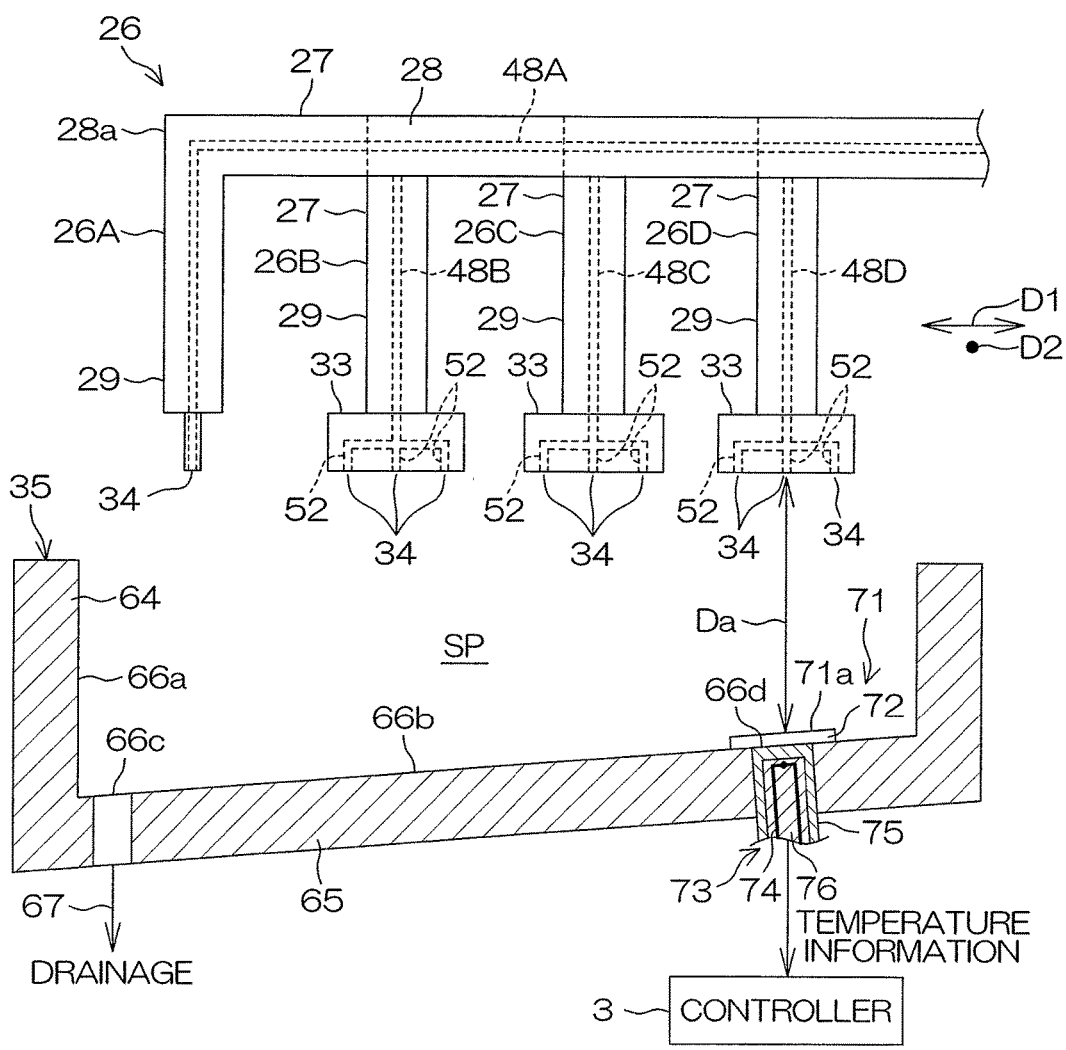
FIG. 8 is a schematic view showing a downstream thermometer and the plurality of processing liquid nozzles positioned at a pre-dispensing position.

FIG. 8 is a schematic view showing the downstream thermometer 71 and the plurality of processing liquid nozzles 26 positioned at the pre-dispensing position. The downstream thermometer 71 is an example of a downstream temperature detection unit.

As shown in FIG. 8, the pot 35 includes a cylindrical peripheral wall 64 and a bottom wall 65 that closes the lower end of the peripheral wall 64. The pot 35 is made of a synthetic resin material, such as PTFE, that has chemical resistance. The inner surface of the pot 35 defines a containing space SP that contains a chemical liquid discharged from the plurality of processing liquid nozzles 26. The inner surface of the pot 35 includes an inner peripheral surface 66a that extends downwardly from the edge of an opening formed in the upper surface of the pot 35 and a bottom surface 66b that closes the lower end of the inner peripheral surface 66a. The bottom surface 66b of the pot 35 extends obliquely downwardly toward an exhaust port 66c that is open in the inner surface of the pot 35. The exhaust port 66c is connected to a discharge pipe 67 through which a liquid in the pot 35 is discharged.

The downstream thermometer 71 detects the temperature of a liquid (herein, chemical liquid) in the pot 35. The downstream thermometer 71 includes a contact member 72 contiguous to the liquid in the pot 35 and a contact thermometer 73 that detects the temperature of the contact member 72 while being in contact with the contact member 72. The contact member 72 is disposed on the bottom surface 66b of the pot 35. The contact member 72 closes a thermometric port 66d that is open in the bottom surface 66b of the pot 35. A gap between the contact member 72 and the pot 35 is sealed up. The contact thermometer 73 is disposed below the contact member 72. The contact thermometer 73 is blocked from the chemical liquid contained in the pot 35 by means of the pot 35 and the contact member 72. Therefore, the chemical liquid in the pot 35 does not come into contact with the contact thermometer 73.

The contact member 72 is positioned below any one of the plurality of processing liquid nozzles 26. FIG. 8 shows an example in which the upper surface of the contact member 72 is positioned below the fourth processing liquid nozzle 260. A chemical liquid discharged from the fourth processing liquid nozzle 26D directly strikes against a downstream contact surface 71a of the downstream thermometer 71 corresponding to the upper surface of the contact member 72. The downstream contact surface 71a is a plane that inclines obliquely downwardly toward the exhaust port 66c.

Therefore, the chemical liquid discharged from the fourth processing liquid nozzle 26D comes into contact with the upper surface of the contact member 72, and is then guided toward the exhaust port 66c by means of the upper surface of the contact member 72.

A distance Da in the vertical direction from the fourth processing liquid nozzle 26D to the contact member 72 is equal to a distance Db in the vertical direction from the fourth processing liquid nozzle 26D to the substrate W (see FIG. 4). FIG. 8 shows an example in which a distance Da in the vertical direction from the processing liquid discharge port 34 (intermediate discharge port) in the center of the fourth processing liquid nozzle 26D to the upper surface of the contact member 72 is equal to a distance Db in the vertical direction from the processing liquid discharge port 34 in the center of the fourth processing liquid nozzle 26D to the upper surface of the substrate W. The pot 35 may be disposed at a height at which the two distances (distance Da and distance Db) coincide with each other. Alternatively, the controller 3 may control the vertical driving unit 24b so that the two distances coincide with each other.

The contact thermometer 73 is a thermocouple thermometer. The contact thermometer 73 includes a thermocouple wire 74 constituted by two kinds of metal wires and a metallic protective pipe 75 that houses the thermocouple wire 74, and an insulating material 76 with which the inside of the protective pipe 75 is filled. The protective pipe 75 is in contact with the contact member 72. The temperature of a chemical liquid contiguous to the upper surface (the downstream contact surface 71a) of the contact member 72 is transmitted to the contact thermometer 73 through the contact member 72. The contact thermometer 73 detects the temperature of the chemical liquid contained in the pot 35 by detecting the temperature of the contact member 72.

The contact member 72 is made of a high-heat conductive material that has high thermal conductivity and chemical resistance. The high-heat conductive material is, for example, silicon carbide (SiC). The thermal conductivity of the high-heat conductive material is higher than the thermal conductivity of a synthetic resin material (e.g., PFA) for use in the synthetic resin portion 63 of the upstream thermometer 61. The thermal conductivity of silicon carbide is 100 to 350 W/m·K, and the thermal conductivity of PFA is 0.19 W/m·K. Therefore, the downstream thermometer 71 detects the temperature of a liquid in a shorter time than the upstream thermometer 61.

Silicon carbide is higher in thermal conductivity than a synthetic resin material, such as PFA, but has the possibility of generating contaminants that contaminate a substrate W in a liquid. The synthetic resin material, such as PFA, does not easily generate such contaminants. However, a chemical liquid that has come into contact with silicon carbide is discharged from the exhaust port 66c of the pot 35 without being supplied to the substrate W. Therefore, even if contaminants are precipitated from silicon carbide, the substrate W is never contaminated by these contaminants.

Pre-Dispensing Step

Figure 9:
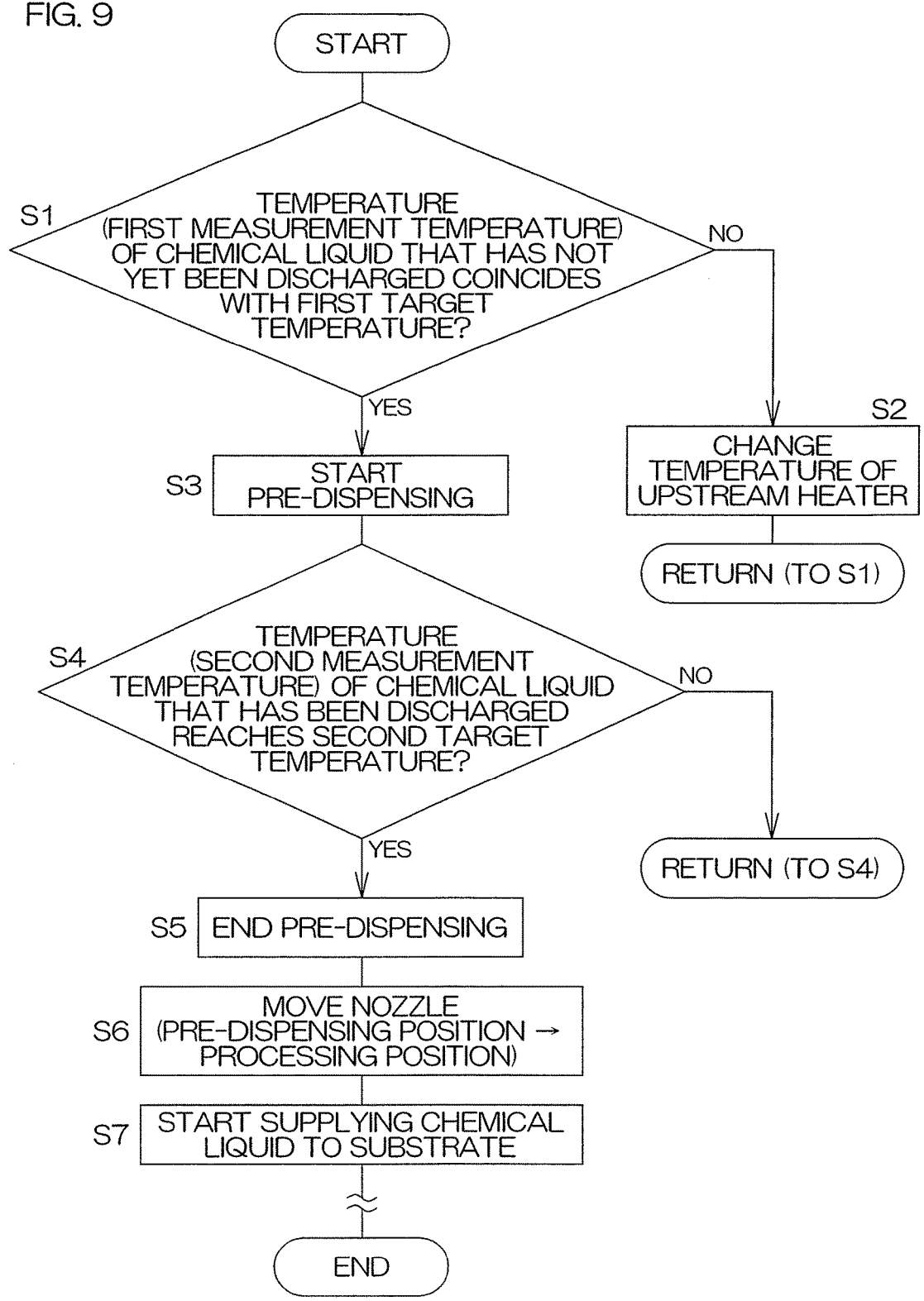
FIG. 9 is a flowchart to describe a pre-dispensing step.
Figure 10:
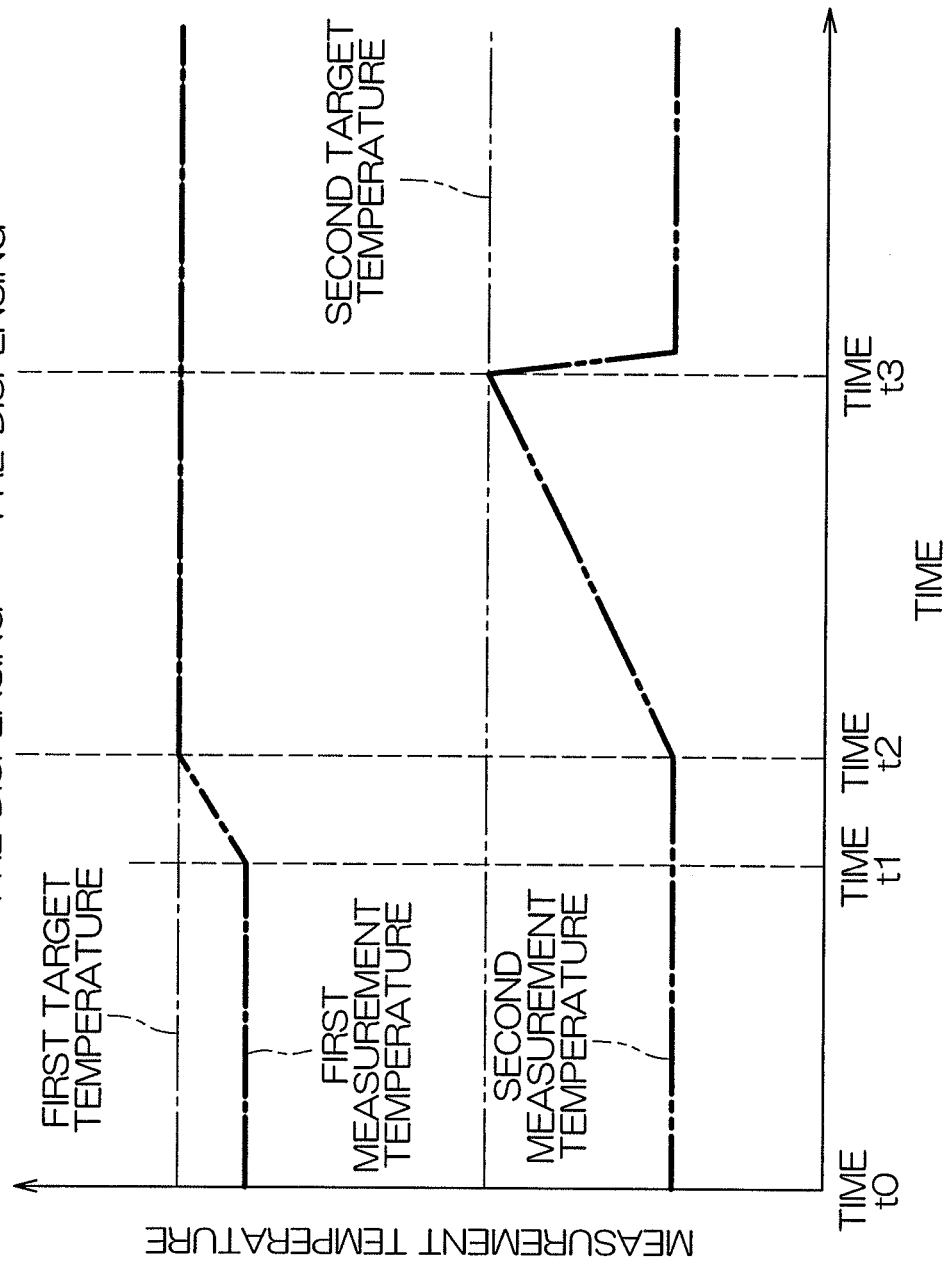
FIG. 10 is a graph showing the transition of liquid temperatures detected by the upstream thermometer and the downstream thermometer.
Figure 11:
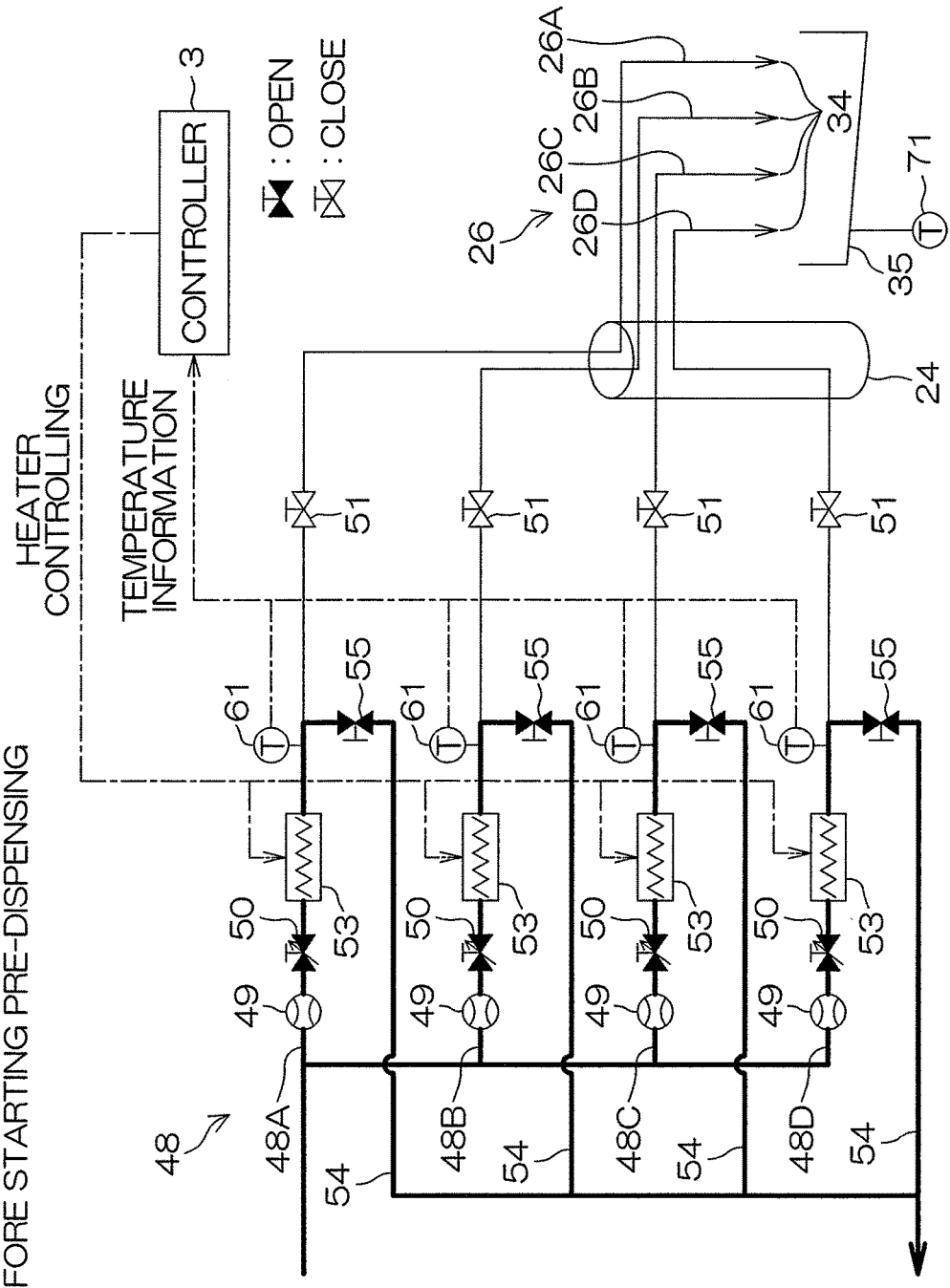
FIG. 11 is a schematic view showing the processing liquid supply system before starting the pre-dispensing step.
Figure 12:
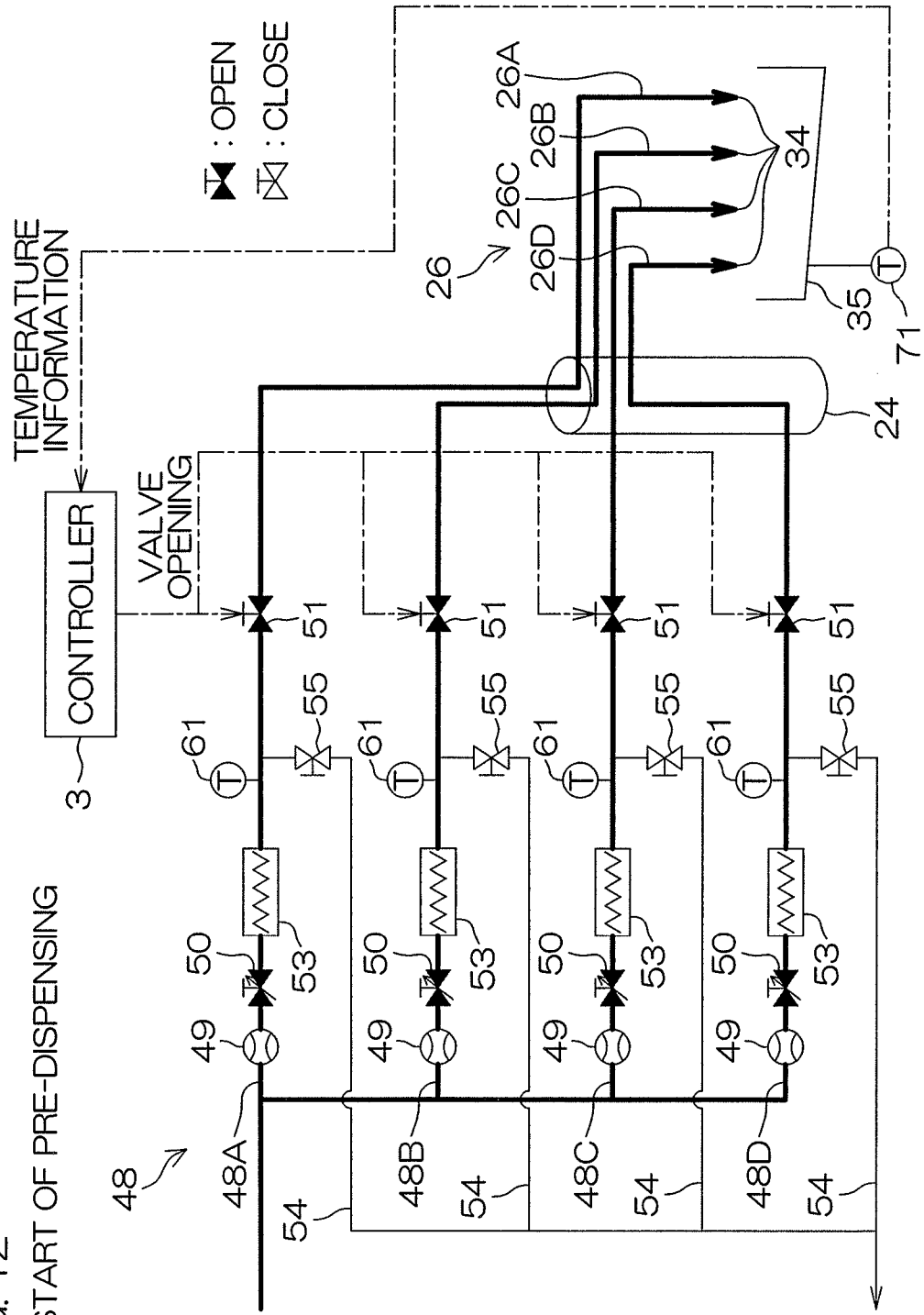
FIG. 12 is a schematic view showing the processing liquid supply system when the pre-dispensing step is started.
Figure 13:
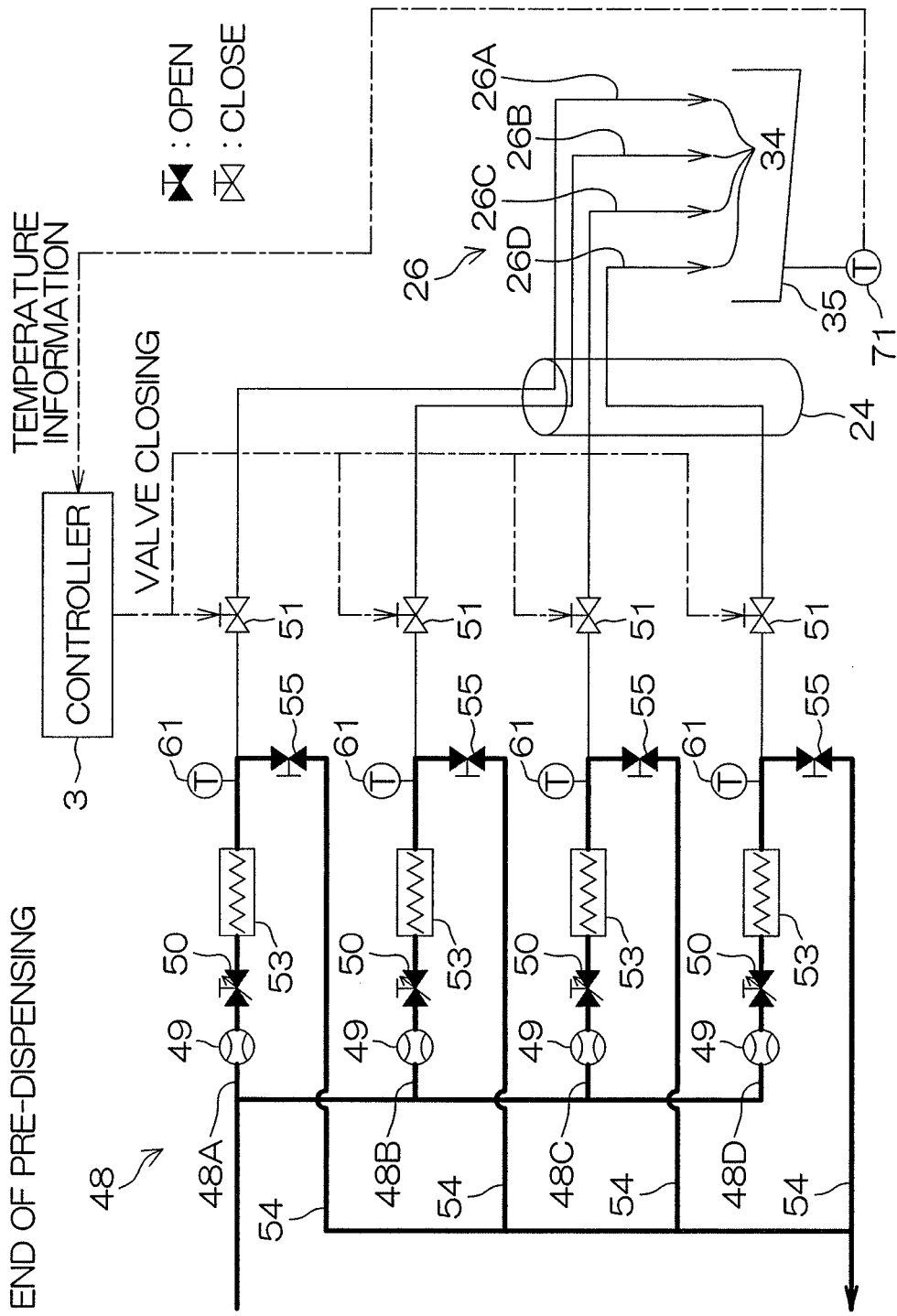
FIG. 13 is a schematic view showing the processing liquid supply system when the pre-dispensing step is ended.

FIG. 9 is a flowchart to describe a pre-dispensing step. FIG. 10 is a graph showing the transition of liquid temperatures detected by the upstream thermometer 61 and the downstream thermometer 71. FIG. 11 to FIG. 13 are schematic views showing the processing liquid supply system. In FIG. 11 to FIG. 13, the position at which a chemical liquid is present is depicted by the thick line.

In FIG. 10, the temperature (first measurement temperature) of a liquid contiguous to the upstream thermometer 61 is depicted by the thick alternate long and short dash line, and the temperature (second measurement temperature) of a liquid contiguous to the downstream thermometer 71 is depicted by the thick alternate long and two short dashes line. Additionally, the target value (first target temperature) of the first measurement temperature is depicted by the alternate long and short dash line, and the target value (the second target temperature) of the second measurement temperature is depicted by the alternate long and short dash line.

In the following description, the term "the first measurement temperature coincides with the first target temperature" denotes that the first measurement temperature coincides with temperatures in a first temperature range (e.g., range of first target temperature ±1° C.) including the first target temperature. The same applies to the term "the second measurement temperature coincides with the second target temperature". The first target temperature and the second target temperature are set for each recipe that prescribes processing conditions of a substrate W. The first target temperature and the second target temperature are stored in the controller 3.

FIG. 11 shows the processing liquid supply system before starting a pre-dispensing step. As shown in FIG. 11, temperature information including the detection value of each upstream thermometer 61 is input to the controller 3. The controller 3 detects the first measurement temperature based on the detection value of the upstream thermometer 61. The controller 3 determines whether the first measurement temperature coincides with the first target temperature, i.e., whether the temperature of the chemical liquid that has not yet been discharged coincides with the first target temperature (step S1 of FIG. 9).

If the first measurement temperature does not coincide with the first target temperature (No in step S1 of FIG. 9), the controller 3 sends a temperature change command to raise or lower the temperature of the downstream heater 53 to the plurality of downstream heaters 53 in order to allow the first measurement temperature to coincide with the first target temperature as shown in FIG. 11 (step S2 of FIG. 9). Thereafter, the controller 3 again determines whether the first measurement temperature coincides with the first target temperature (return to step S1 of FIG. 9). Accordingly, a difference between the first measurement temperature and the first target temperature decreases, and the first measurement temperature coincides with the first target temperature.

FIG. 10 shows an example in which the first measurement temperature is lower than the first target temperature at the point of time t0 because a new first target temperature has been input to the controller 3 from the host computer. In this example, the controller 3 raises the temperature of the downstream heater 53 so that the first measurement temperature coincides with the new first target temperature. Accordingly, the first measurement temperature rises from time t1 to time t2. After time t2, the temperature of the downstream heater 53 is kept at a substantially constant level, and the first measurement temperature is kept at the first target temperature.

FIG. 12 shows the processing liquid supply system when the pre-dispensing step is started. If the first measurement temperature coincides with the first target temperature (Yes in step S1 of FIG. 9), the controller 3 sends a valve open command to open the plurality of discharge valves 51 to the plurality of discharge valves 51 as shown in FIG. 12. Accordingly, the plurality of discharge valves 51 are opened. Therefore, the plurality of processing liquid nozzles 26 positioned at the pre-dispensing position starts discharging a chemical liquid, and the chemical liquid starts being supplied to the pot 35 (step S3 of FIG. 9).

When the discharge of the chemical liquid is started, i.e., when the pre-dispensing step is started, the temperature of the chemical liquid starts being detected by the downstream thermometer 71. As shown in FIG. 12, temperature information including the detection value of the downstream thermometer 71 is input to the controller 3. The controller 3 detects a second measurement temperature based on the detection value of the downstream thermometer 71. While allowing the plurality of processing liquid nozzles 26 to discharge the chemical liquid, the controller 3 determines whether the second measurement temperature has reached the second target temperature, i.e., whether the temperature of the chemical liquid that has already been discharged has reached the second target temperature (step S4 of FIG. 9).

As shown in FIG. 10, when the pre-dispensing step is started at time t2, the second measurement temperature rises in response to the lapse of time. The reason is that the temperatures of the piping and the like forming a tip flow passage ranging from the discharge valve 51 to the processing liquid discharge port 34 approach the temperature of the chemical liquid, and hence a change in temperature of the chemical liquid in the piping etc., decreases. When the second measurement temperature reaches the second target temperature at time t3 (Yes in step S4 of FIG. 9), the controller 3 sends a valve close command to close the plurality of discharge valves 51 to the plurality of discharge valves 51 as shown in FIG. 13. Accordingly, the plurality of discharge valves 51 are closed. Therefore, the plurality of processing liquid nozzles 26 positioned at the pre-dispensing position end the discharge of the chemical liquid, and hence the supply of the chemical liquid to the pot 35 is ended (step S5 of FIG. 9). Therefore, as shown in FIG. 10, the second measurement temperature falls immediately after time t3, and, after that, the second measurement temperature is stabilized at the room temperature.

As shown in FIG. 10, the second target temperature is lower than the first target temperature. The reason is that the temperature of the chemical liquid falls during the flow of the chemical liquid from the discharge valve 51 to the processing liquid discharge port 34 and after the discharge of the chemical liquid from the processing liquid discharge port 34. The second target temperature is a temperature obtained when a fall in temperature of the chemical liquid in the tip flow passage from the discharge valve 51 to the processing liquid discharge port 34 becomes stable. In other words, the second target temperature is a temperature obtained after the temperatures of the piping and the like forming the tip flow passage from the discharge valve 51 to the processing liquid discharge port 34 become stable. Therefore, if the chemical liquid continues to be discharged after the second measurement temperature reaches the second target temperature, the second measurement temperature will be stabilized at the second target temperature. A relationship between the first target temperature and the second target temperature is calculated by measurement.

As described above, the downstream thermometer 71 detects the temperature of the chemical liquid supplied from the fourth processing liquid nozzle 26D to the pot 35. The temperatures of the piping etc., are stable after the second measurement temperature reaches the second target temperature, and therefore the temperature of the chemical liquid discharged from the fourth processing liquid nozzle 26D is stabilized. Additionally, in each processing liquid nozzle 26, the length of the tip flow passage from the discharge valve 51 to the processing liquid discharge port 34 is the same or roughly same, and therefore it is expected that, when the temperature of the chemical liquid discharged from the fourth processing liquid nozzle 26D is stabilized, the temperature of the chemical liquid discharged from the other processing liquid nozzles 26 (the first processing liquid nozzle 26A, the second processing liquid nozzle 26B, and the third processing liquid nozzle 26C) will be also stabilized.

The controller 3 allows the plurality of processing liquid nozzles 26 to end the discharge of the chemical liquid and then move from the pre-dispensing position to the processing position (step S6 of FIG. 9). Thereafter, the controller 3 allows the plurality of processing liquid nozzles 26 to discharge the chemical liquid (step S7 of FIG. 9). In other words, after finishing the pre-dispensing step, the controller 3 successively performs the chemical liquid supply step, the rinse liquid supply step, and the drying step. As a result, the chemical liquid having a temperature that coincides with an intended temperature or that is extremely near the intended temperature is supplied from each processing liquid nozzle 26D to the substrate W.

As described above, in the present preferred embodiment, the processing liquid discharge port 34 is allowed to continue discharging the chemical liquid that is an example of a processing fluid toward the pot 35 at the pre-dispensing position, and the temperature of the chemical liquid supplied to the pot 35 is detected. Thereafter, when the temperature of the chemical liquid supplied to the pot 35 reaches the target temperature, the processing liquid discharge port 34 is allowed to stop the discharge of the chemical liquid. Thereafter, a positional relationship between the processing liquid discharge port 34 and the pot 35 is changed, and the processing liquid discharge port 34 is allowed to discharge the chemical liquid toward the substrate W at the processing position. Accordingly, the chemical liquid is supplied to the substrate W, and the substrate W is processed with the chemical liquid.

As described above, the processing liquid discharge port 34 is allowed to discharge a chemical liquid before supplying the chemical liquid to a substrate W to be processed, and therefore it is possible to stabilize the temperature of the chemical liquid supplied to the substrate W, and it is possible to reduce non-uniformity in processing quality. Additionally, the discharge of the chemical liquid is stopped based on an actual temperature of the chemical liquid supplied to the pot 35, and therefore it is possible to reduce the discharge of an unnecessary chemical liquid. This makes it possible to shorten a period of time required for the pre-dispensing step while reducing non-uniformity in processing quality.

Additionally, in the present preferred embodiment, a chemical liquid discharged from the processing liquid discharge port 34 directly strikes against the downstream contact surface 71a of the downstream thermometer 71. Therefore, it is possible to control a change in temperature given to the chemical liquid by means of the other members, and it is possible to accurately detect the temperature of the chemical liquid supplied to the pot 35.

Additionally, in the present preferred embodiment, the downstream contact surface 71a of the downstream thermometer 71 inclines obliquely, and therefore the chemical liquid supplied to the downstream contact surface 71a flows obliquely downwardly along the downstream contact surface 71a. Therefore, it is possible to restrain or prevent the chemical liquid from staying on the downstream contact surface 71a. Additionally, the chemical liquid flows along the downstream contact surface 71a, and therefore it is possible to widen an area in which the chemical liquid comes into contact with the downstream contact surface 71a. This makes it possible to accurately detect the temperature of the chemical liquid.

Additionally, in the present preferred embodiment, the chemical liquid supplied from the processing liquid discharge port 34 to the pot 35 is discharged from the pot 35 by means of the exhaust port 66c. The chemical liquid supplied to the downstream contact surface 71a is guided toward the exhaust port 66c by means of the downstream contact surface 71a that inclines obliquely downwardly. This makes it possible to hasten the discharge of the chemical liquid from the inside of the pot 35, and makes it possible to restrain or prevent the chemical liquid from stagnating on the downstream contact surface 71a.

Additionally, in the present preferred embodiment, the downstream contact surface 71a is made of silicon carbide. Silicon carbide has not only chemical resistance but also high thermal conductivity. Therefore, it is possible to shorten a period of time required to detect the temperature of the chemical liquid by making the downstream contact surface 71a of the downstream thermometer 71 of a material including silicon carbide. Additionally, although silicon carbide has the possibility of generating contaminants that contaminate a substrate W in a chemical liquid, the chemical liquid supplied to the pot 35 is discharged from the pot 35 without being supplied to the substrate W. Therefore, it is possible to detect the temperature of the chemical liquid in a short time while preventing the substrate W from being contaminated by contaminants precipitated from silicon carbide.

Additionally, in the present preferred embodiment, the upstream thermometer 61 is disposed upstream of the discharge valve 51, and therefore the upstream contact surface 61a of the upstream thermometer 61 is in contact with the chemical liquid that is present in the upstream flow passage 48 that is an example of the supply passage even when the discharge valve 51 is in a closed state. Therefore, even if a period of temperature detection time by means of the upstream thermometer 61 is comparatively long, any problems will never arise with respect to throughput or chemical liquid consumption.

On the other hand, if a period of temperature detection time by means of the downstream thermometer 71 is long, the chemical liquid continues to be discharged in spite of the fact that the temperature of the chemical liquid discharged from the processing liquid discharge port 34 is stable. The downstream contact surface 71a of the downstream thermometer 71 is made of a material higher in thermal conductivity than the upstream contact surface 61a of the upstream thermometer 61. Therefore, it is possible to shorten the period of temperature detection time by means of the downstream thermometer 71, and it is possible to reduce the discharge of an unnecessary chemical liquid.

Additionally, in the present preferred embodiment, the distance Da (see FIG. 8) to the downstream thermometer 71 from the processing liquid discharge port 34 at the pre-dispensing position is equal to the distance Db (see FIG. 8) to the substrate W from the processing liquid discharge port 34 at the processing position. The temperature of the chemical liquid discharged toward the substrate W slightly changes in a space between the processing liquid discharge port 34 and the substrate W. It is possible to artificially detect the temperature of the chemical liquid actually supplied to the substrate W because the two distances (distance Da and distance Db) are equal to each other. This makes it possible to more precisely monitor the processing conditions of the substrate W.

Other Preferred Embodiments

The present invention is not restricted to the content of the preferred embodiment and various modifications are possible within the scope of the present invention.

For example, the number of processing liquid nozzles 26 provided in the same processing unit 2 may be one to three, or may be five or more.

A fluid discharged from the processing liquid nozzle 26 may be a processing liquid other than the chemical liquid, or may be a processing gas, or may be a mixed fluid including a liquid and a gas. For example, a mist or a vapor of the processing liquid may be discharged from the processing liquid nozzle 26.

The number of downstream flow passages 52 and processing liquid discharge ports 34 formed in one nozzle head 33 may be two or may be four or more.

The nozzle head 33 may be disposed at the first processing liquid nozzle 26A, in addition to the second processing liquid nozzle 26B, the third processing liquid nozzle 26C, and the fourth processing liquid nozzle 26D. On the contrary, the nozzle head 33 is not necessarily required to be disposed at any processing liquid nozzles 26.

Figure 14:
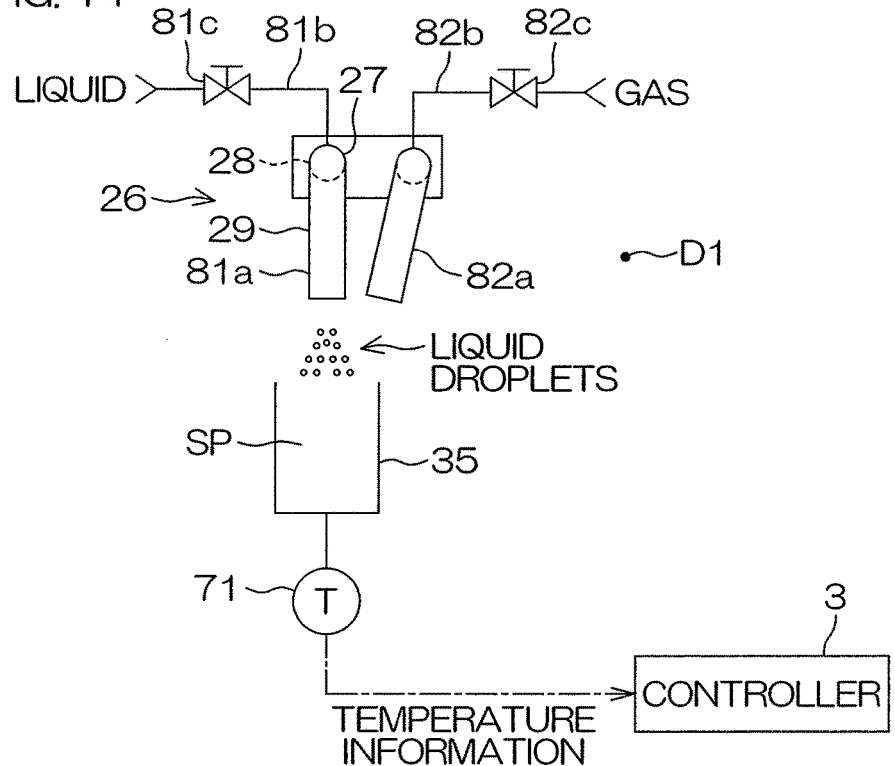
FIG. 14 is a schematic view of a processing liquid nozzle according to another preferred embodiment of the present invention when viewed horizontally.

As shown in FIG. 14, the processing liquid nozzle 26 may be a two-fluid nozzle that creates a plurality of liquid droplets that strike against a substrate W by allowing a liquid and a gas to collide with each other. The two-fluid nozzle may be an internal mixing nozzle that allows a liquid and a gas to collide with each other inside the two-fluid nozzle, or may be an external mixing nozzle that allows a liquid and a gas to collide with each other outside the two-fluid nozzle. FIG. 14 shows an example in which the processing liquid nozzle 26 is an external mixing nozzle. The processing liquid nozzle 26 includes a liquid nozzle 81a that discharges a liquid and a gas nozzle 82a that discharges a gas.

As shown in FIG. 14, the liquid nozzle 81a is connected to a liquid piping 81b in which a liquid valve 81c is interposed. The gas nozzle 82a is connected to a gas piping 82b in which a gas valve 82c is interposed. Pure water that is an example of the liquid is supplied from the liquid piping 81b to the liquid nozzle 81a. Nitrogen gas that is an example of the gas is supplied from the gas piping 82b to the gas nozzle 82a. A plurality of liquid droplets created by a collision between pure water and nitrogen gas are supplied to the pot 35 at the pre-dispensing position. Accordingly, the temperature of the plurality of liquid droplets is detected by the downstream thermometer 71.

Figure 15:
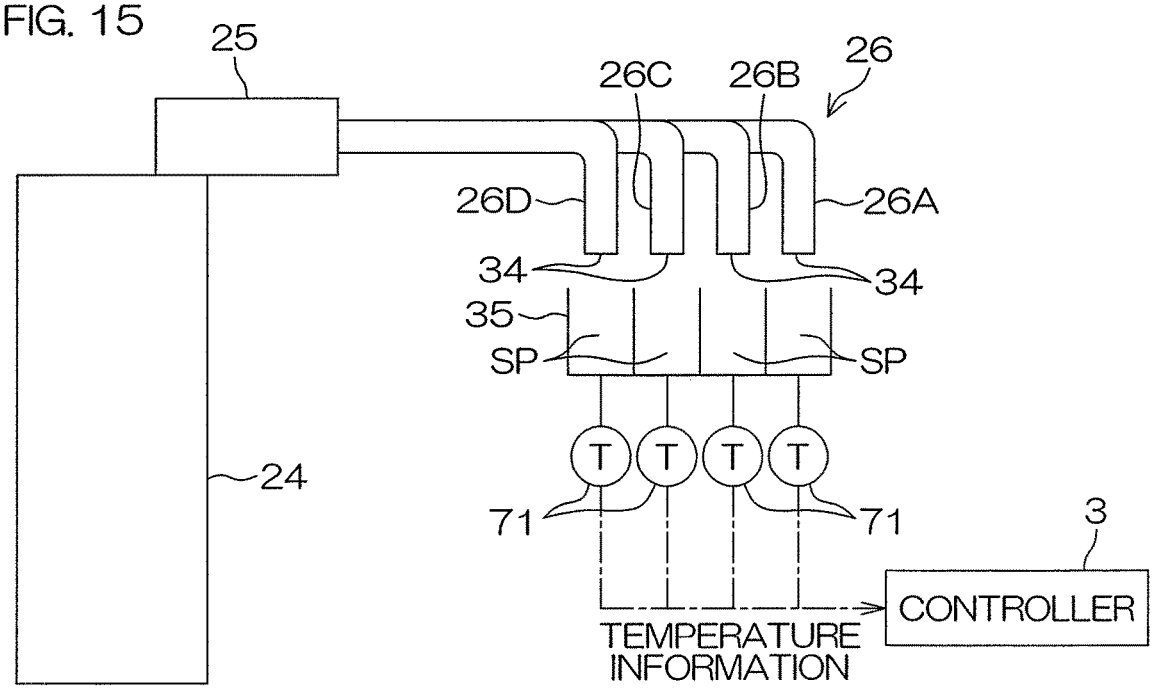
FIG. 15 is a schematic view of a processing liquid nozzle and a pot according to still another preferred embodiment of the present invention when viewed horizontally.

As shown in FIG. 15, the pot 35 may define a plurality of containing spaces SP that correspond to the plurality of processing liquid nozzles 26, respectively. In this case, the downstream thermometer 71 may be provided in each containing space SP. The downstream thermometer 71 may detect not the temperature of a chemical liquid in the pot 35 but the temperature of a chemical liquid in the discharge pipe 67 (see FIG. 8).

The processing unit 2 may additionally include a position changing unit that changes a positional relationship between the plurality of processing liquid nozzles 26 and the pot 35 by moving only the pot 35 or by moving both the plurality of processing liquid nozzles 26 and the pot 35. In this case, the pre-dispensing position may be a position at which the plurality of processing liquid nozzles 26 overlap with the substrate W when viewed planarly.

The downstream contact surface 71a of the downstream thermometer 71 may be made of a material other than silicon carbide. For example, the downstream contact surface 71a of the downstream thermometer 71 may be made of the same kind of material as that of the upstream contact surface 61a of the upstream thermometer 61. In other words, the downstream contact surface 71a of the downstream thermometer 71 may be made of a synthetic resin material that has chemical resistance.

The downstream contact surface 71a of the downstream thermometer 71 may be disposed at a place other than the place against which a processing liquid discharged from the fourth processing liquid nozzle 26D directly strikes. The downstream contact surface 71a of the downstream thermometer 71 may be a horizontal flat surface, or may be a rugged surface, or may be a curved surface.

The distance Da in the vertical direction to the downstream contact surface 71a of the downstream thermometer from the processing liquid discharge port 34 at the pre-dispensing position may differ from the distance Db in the vertical direction to the substrate W from the processing liquid discharge port 34 at the processing position.

The controller 3 may change the temperature of the downstream heater 53 based on the detection value of the downstream thermometer 71. In this case, it is possible to more precisely control the temperature of a chemical liquid supplied to the substrate W.

Two or more of all the elements described above may be combined. Two or more of all the steps described above may be combined.

The present invention corresponds to Japanese Patent Application No. 2015-123059 filed on Jun. 18, 2015 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing apparatus comprising:
a discharge port that discharges a processing fluid that processes a substrate;
a supply passage that guides the processing fluid to the discharge port;
a discharge valve interposed in the supply passage;
a substrate holding unit that rotates the substrate to be processed by the processing fluid discharged from the discharge port while horizontally holding the substrate;
a pot that receives the processing fluid discharged from the discharge port;
a position changing unit that changes a positional relationship between the discharge port and the pot between a processing position at which the processing fluid discharged from the discharge port is supplied to the substrate held by the substrate holding unit and a pre-dispensing position at which the processing fluid discharged from the discharge port is supplied to the pot;
a downstream temperature detection unit that detects a temperature of the processing fluid supplied from the discharge port to the pot; and
a controller that controls the discharge valve and the position changing unit, wherein
the controller performs:
a first step of allowing the discharge port to discharge the processing fluid at the pre-dispensing position at which the processing fluid discharged from the discharge port is supplied to the pot by opening the discharge valve interposed in the supply passage that guides the processing fluid to the discharge port that discharges the processing fluid that processes the substrate;
a second step of detecting the temperature of the processing fluid discharged from the discharge port with the downstream temperature detection unit in parallel with the first step;
a third step of, based on the temperature of the processing fluid detected in the second step, stopping supplying the processing fluid from the discharge port to the pot; and
a fourth step of, after finishing the third step, allowing the discharge port to discharge the processing fluid at the processing position at which the processing fluid discharged from the discharge port is supplied to the substrate held by the substrate holding unit.

2. The substrate processing apparatus according to claim 1, wherein the downstream temperature detection unit includes a downstream contact surface disposed at a place against which the processing fluid discharged from the discharge port directly strikes.

3. The substrate processing apparatus according to claim 1, wherein the downstream temperature detection unit includes a downstream contact surface that inclines obliquely with respect to a horizontal plane, and detects the temperature of the processing fluid contiguous to the downstream contact surface.

4. The substrate processing apparatus according to claim 3, wherein the pot includes an exhaust port that discharges the processing fluid from an inside of the pot, and the downstream contact surface inclines obliquely downwardly toward the exhaust port.

5. The substrate processing apparatus according to claim 1, wherein the downstream temperature detection unit includes a downstream contact surface made of a material including silicon carbide, and detects the temperature of the processing fluid contiguous to the downstream contact surface.

6. The substrate processing apparatus according to claim 1 further comprising an upstream temperature detection unit that detects the temperature of the processing fluid that is present in the supply passage on an upstream side of the discharge valve,
wherein the upstream temperature detection unit includes an upstream contact surface contiguous to the processing fluid that is present in the supply passage, and detects the temperature of the processing fluid contiguous to the upstream contact surface, and
wherein the downstream temperature detection unit includes a downstream contact surface made of a material having higher thermal conductivity than the upstream contact surface of the upstream temperature detection unit, and detects the temperature of the processing fluid contiguous to the downstream contact surface.

7. The substrate processing apparatus according to claim 1, wherein a distance to the downstream temperature detection unit from the discharge port at the pre-dispensing position is equal to a distance to the substrate from the discharge port at the processing position.

* * * * *